(12) United States Patent
Chen et al.

(10) Patent No.: US 9,093,312 B2
(45) Date of Patent: Jul. 28, 2015

(54) SEMICONDUCTOR DEVICE AND MANUFACTURING METHOD THEREOF

(71) Applicant: Industrial Technology Research Institute, Hsinchu (TW)

(72) Inventors: Shang-Chun Chen, Hsinchu County (TW); Cha-Hsin Lin, Miaoli County (TW); Tzu-Kun Ku, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/019,548

(22) Filed: Sep. 6, 2013

(65) Prior Publication Data

US 2014/0346666 A1 Nov. 27, 2014

(30) Foreign Application Priority Data

May 23, 2013 (TW) .............................. 102118253 A

(51) Int. Cl.
*H01L 23/04* (2006.01)
*H01L 23/00* (2006.01)
(Continued)

(52) U.S. Cl.
CPC ............ *H01L 24/11* (2013.01); *H01L 21/4803* (2013.01); *H01L 21/486* (2013.01); *H01L 23/145* (2013.01); *H01L 23/49827* (2013.01); *H01L 25/065* (2013.01); *H01L 24/81* (2013.01); *H01L 2224/16235* (2013.01); *H01L 2224/81192* (2013.01)

(58) Field of Classification Search
CPC ......... H01L 24/11; H01L 24/14; H01L 24/81; H01L 23/145

USPC ................... 438/637, 667; 257/698, 737, 774
See application file for complete search history.

(56) References Cited

U.S. PATENT DOCUMENTS 7,083,436 B2 8/2006 Brodsky
7,605,463 B2 10/2009 Sunohara et al.
(Continued)

FOREIGN PATENT DOCUMENTS

CN 101996979 A 3/2011
JP 2001-352000 12/2001
(Continued)

OTHER PUBLICATIONS

Yoshida, A.; et al, "A Study on an Ultra Thin PoP using Through Mold Via Technology," 61st Electronic Components and Technology Conference (ECTC), May 31, 2011-Jun. 3, 2011, pp. 1547-1551.
(Continued)

*Primary Examiner* — Tu-Tu Ho
(74) *Attorney, Agent, or Firm* — Jianq Chyun IP Office

(57) ABSTRACT

A semiconductor device and a manufacturing method thereof are provided. The manufacturing method includes following steps. A mold is provided. The mold has a chamber and a plurality of protrusions in the chamber. A thermosetting material is injected into the chamber. The thermosetting material is cured. A parting step is performed to separate the cured thermosetting material from the mold, so as to form an interposer substrate. A plurality of blind holes corresponding to the protrusions is formed on the interposer substrate. A conductive material is filled into the blind holes to form a plurality of conductive pillars. A conductive pattern layer is formed on a surface of the interposer substrate. The conductive pattern layer is electrically connected with the conductive pillars.

9 Claims, 22 Drawing Sheets

(51) Int. Cl.
*H01L 21/48* (2006.01)
*H01L 25/065* (2006.01)
*H01L 23/14* (2006.01)
*H01L 23/498* (2006.01)

(56) References Cited

U.S. PATENT DOCUMENTS

| 2003/0094666 | A1 | 5/2003 | Clayton et al. | |
|---|---|---|---|---|
| 2010/0102426 | A1* | 4/2010 | Park et al. | 257/686 |
| 2012/0211885 | A1 | 8/2012 | Choi et al. | |

FOREIGN PATENT DOCUMENTS

| JP | 2006-066517 | 3/2006 |
|---|---|---|
| JP | 2012-174791 | 9/2012 |
| TW | 201220450 | 5/2012 |
| TW | 201236088 | 9/2012 |

OTHER PUBLICATIONS

Dreiza, M.; et al., "Joint Project for Mechanical Qualification of Next Generation High Density Package-on-Package (PoP) with Through Mold Via Technology," European Microelectronics and Packaging Conference, Jun. 15-18, 2009, pp. 1-8.

Jinseong Kim; et al., "Application of Through Mold Via (TMV) as PoP Base Package," 58th Electronic Components and Technology Conference, May 27-30, 2008 , pp. 1089-1092.

Soon Wee Ho; et al., "Double Side Redistribution Layer Process on Embedded Wafer Level Package for Package on Package (PoP) Applications," 12th Electronics Packaging Technology Conference (EPTC), Dec. 8-10, 2010, pp. 383-387.

Braun, T.; et al., "Through Mold Vias for Stacking of Mold Embedded Packages," 61st Electronic Components and Technology Conference (ECTC), May 31, 2011-Jun. 3, 2011 , pp. 48-54.

"Office Action of Taiwan Counterpart Application" , issued on Apr. 23, 2015, p1-p5, in which the listed references were cited.

* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 102118253, filed on May 23, 2013. The entirety of the above-mentioned patent application is hereby incorporated by reference herein and made a part of this specification.

TECHNICAL FIELD

The technical field relates to a semiconductor device and a manufacturing method thereof, and more particularly, to a semiconductor device manufactured by using a mould and a manufacturing method thereof.

BACKGROUND

In recent years, in the semiconductor industry, a 3D stacking technology is developed to shorten the wiring between chips, reduce the sizes of devices, and help to construct a complete 3D chip structure. Through-substrate vias (TSV) are key components for connecting vertically stacked chips in the 3D stacking technology.

An interposer can be disposed to replace the wire packaging technique for electrically connecting heterogeneous chips. Even though through-silicon vias (TSV) and a redistribution layer (RDL) of optimal dimension ratios can be realized in an interposer along with the development of the 3D stacking technology, many costly semiconductor process steps need to be performed repeatedly to achieve the TSV and the RDL of the optimal dimension ratios. As a result, the manufacturing cost cannot be effectively reduced.

SUMMARY

An embodiment of the present disclosure provides a manufacturing method of a semiconductor device. The manufacturing method includes following steps. A mould is provided. The mould has a chamber and a plurality of protrusions in the chamber. A thermosetting material is injected into the chamber. The thermosetting material is cured. A parting step is performed to separate the cured thermosetting material from the mould, so as to form an interposer substrate. A plurality of blind holes corresponding to the protrusions is formed on the interposer substrate. A conductive material is filled into the blind holes to form a plurality of conductive pillars. A conductive pattern layer is formed on a first surface of the interposer substrate. The first conductive pattern layer is electrically connected with the conductive pillars.

An embodiment of the present disclosure provides a manufacturing method of a semiconductor device. The manufacturing method includes following steps. A mould and a metal film are provided. The mould has a cover and a chamber, and the cover has a plurality of vias. The metal film is heated and pressed to the cover to pass the metal film through the vias of the cover and form a plurality of conductive pillars in the chamber. A thermosetting material is injected into the chamber of the mould to allow the thermosetting material to encapsulate the conductive pillars. The thermosetting material is cured. A parting step is performed to separate the cured thermosetting material from the mould, so as to form an interposer substrate. The conductive pillars are in the interposer substrate. A first conductive pattern layer is formed on a first surface of the interposer substrate. The first conductive pattern layer is electrically connected with the conductive pillars.

An embodiment of the present disclosure provides a semiconductor device. The semiconductor device includes an interposer substrate, a plurality of conductive pillars, and a first conductive pattern layer. The material of the interposer substrate is an insulator. The interposer substrate has a first surface. A plurality of blind holes and a plurality of grooves are formed on the first surface of the interposer substrate. A plurality of conductive pillars is in the blind holes of the interposer substrate. The first conductive pattern layer is disposed in the grooves. A surface of the first conductive pattern layer and the first surface of the interposer substrate are coplanar.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
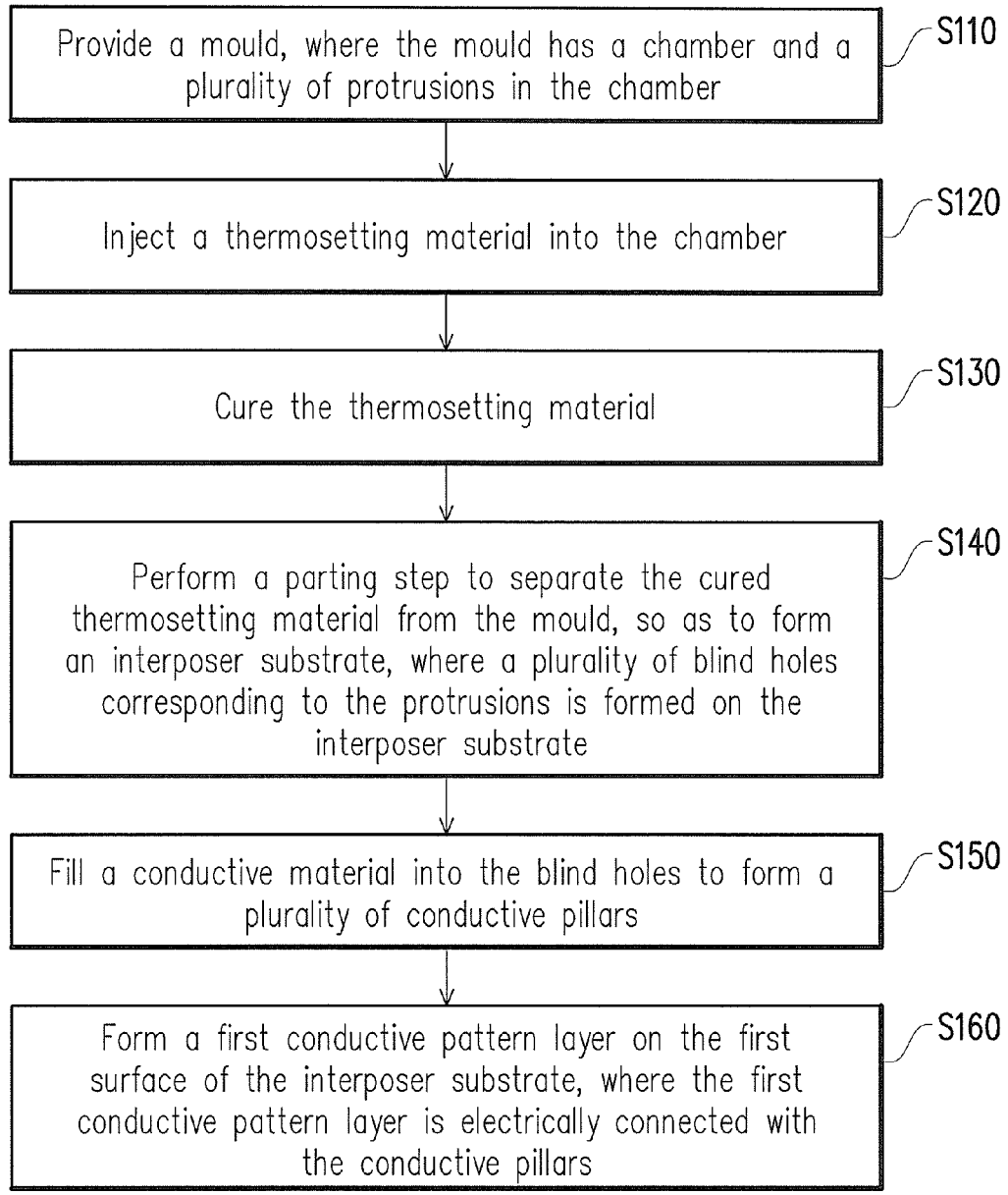
FIG. 1 is a flowchart of a manufacturing method of a semiconductor device according to an embodiment of the present disclosure.
Figure 2A:
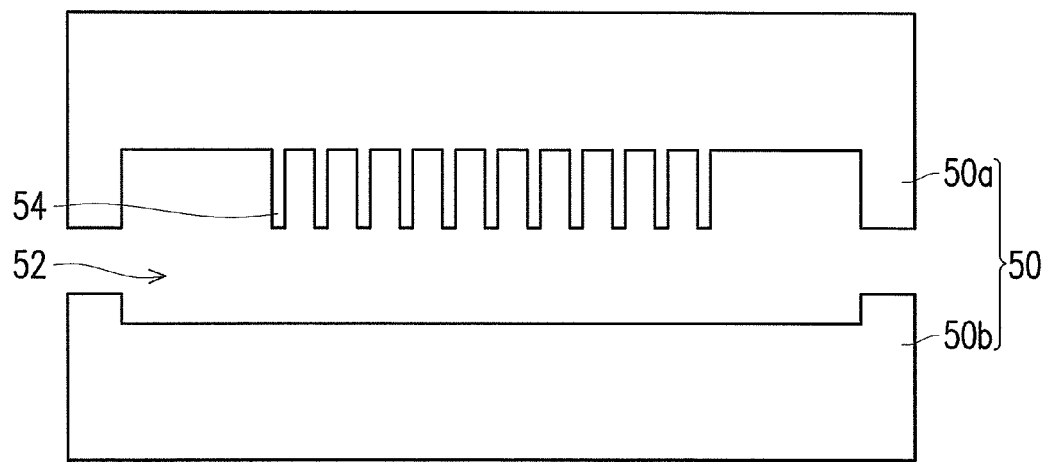
FIGS. 2A-2L are diagrams illustrating the manufacturing method of a semiconductor device in FIG. 1.
Figure 2B:
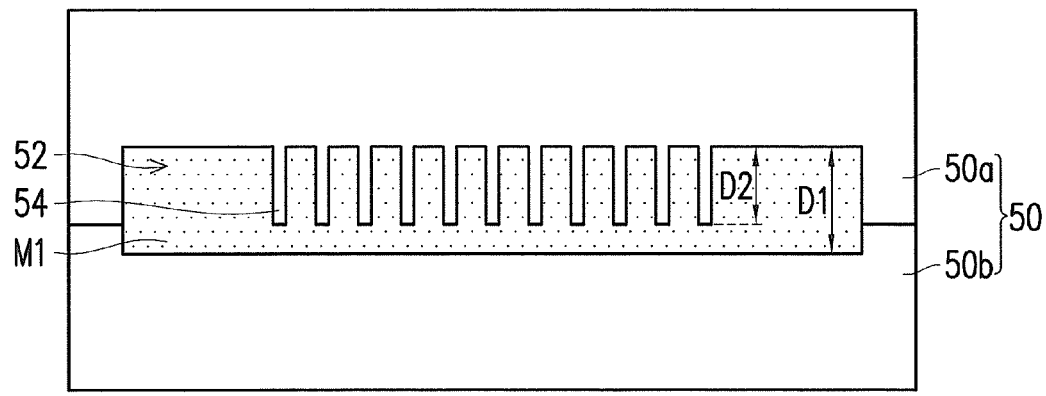
Figure 2C:
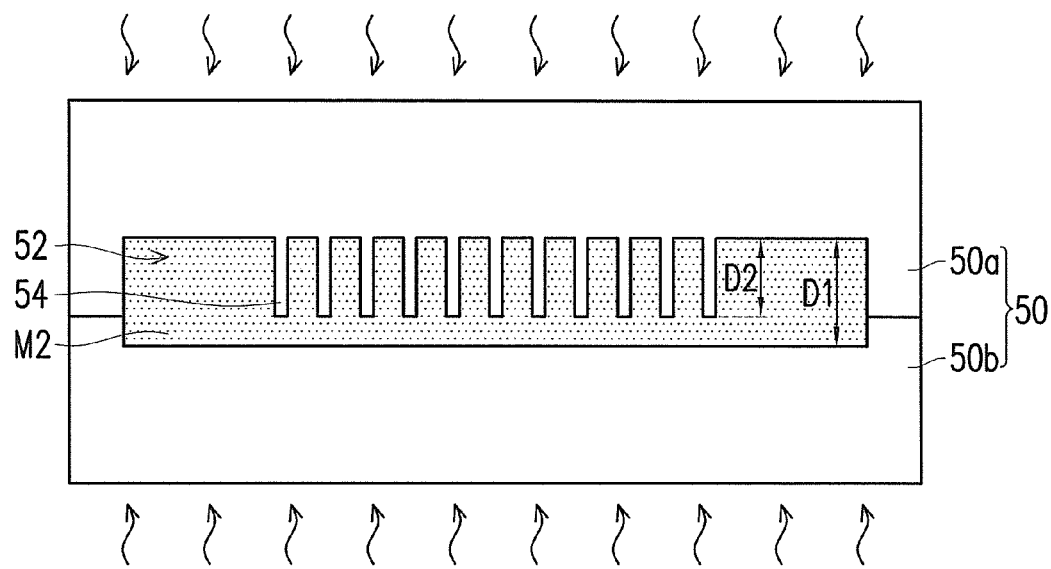

FIG. 1 is a flowchart of a manufacturing method of a semiconductor device according to an embodiment of the present disclosure. FIGS. 2A-2L are diagrams illustrating the semiconductor device manufacturing method in FIG. 1. FIG. 3 is a diagram of a mould in FIG. 2A according to another embodiment of the present disclosure. Referring to FIG. 1 and FIG. 2A first, a mould 50 is provided, where the mould 50 has a chamber 52 and a plurality of protrusions 54 in the chamber 52 (step S110). To be specific, the chamber 52 is composed of a top cover 50a and a bottom cover 50b, and the spacing of the chamber 52 is D1 (as shown in FIG. 2B). In the present embodiment, the spacing of the chamber 52 is D1 and may be slightly smaller than 5 mm.

In the present embodiment, the mould 50 and the protrusions 54 are integrally formed by using the same material. For example, the mould 50 and the protrusions 54 are made of tungsten alloy. In other embodiments, as shown in FIG. 3, the mould 50 and the protrusions 54a may also be formed by using different materials. For example, the protrusions 54a are formed by using silicon or tungsten alloy on a top cover 50c of the mould 50, while the mould 50 is formed by using a metal material different from that of the protrusions 54a.

The length of the protrusions 54 is D2 (as shown in FIG. 2B). However, the spacing of the chamber and the length of the protrusions are not limited in the present disclosure and can be adjusted according to the actual requirement. Besides, in the present embodiment, the length D2 of the protrusions 54 is smaller than the spacing D1 of the chamber 52.

Referring to FIG. 2B again, a thermosetting material M1 is injected into the chamber 52 (step S120). In the present embodiment, the thermosetting material M1 is an insulator, such as epoxy molding compound (EMC), polyimide (PI), silicone resin, polyurethane (PU), or a compound of one of aforementioned material with a filler, a hardener, a coupling agent, or any other additive agent. Next, referring to FIG. 2C, the thermosetting material M1 is cured (step S130) and turned into a cured thermosetting material M2.

Figure 2D:
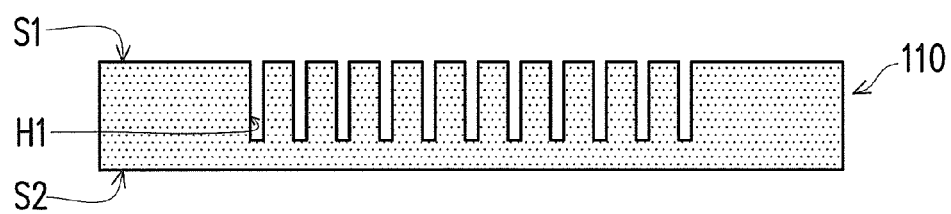
Figure 3:
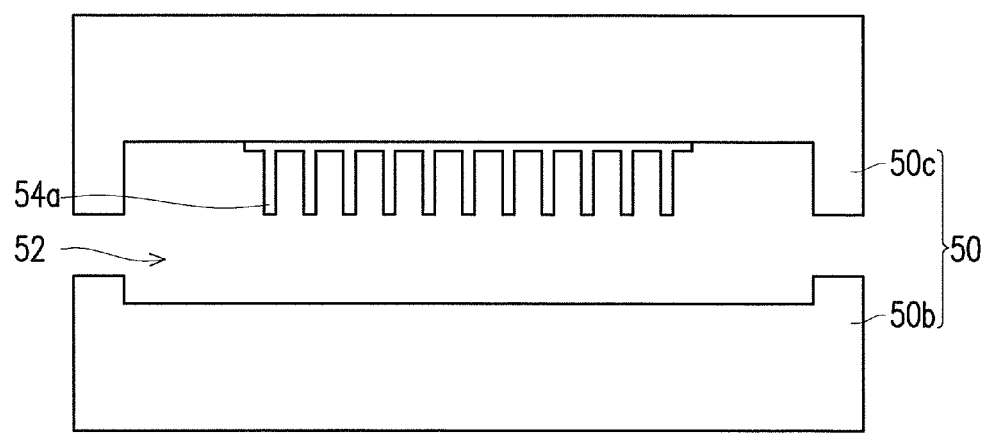
FIG. 3 is a diagram of a mould in FIG. 2A according to another embodiment of the present disclosure.

Thereafter, referring to FIG. 2D, a parting step is performed to separate the cured thermosetting material M2 from the mould 50, so as to form an interposer substrate 110. A plurality of blind holes H1 corresponding to the protrusions 54 are formed on the interposer substrate 110 (step S140).

Figure 2E:
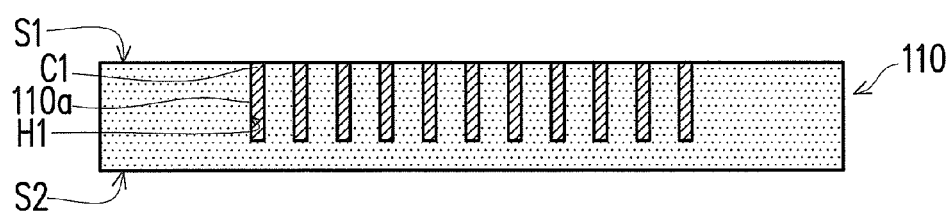

Referring to FIG. 2E, a conductive material C1 is filled into the blind holes H1 to form a plurality of conductive pillars 110a (step S150). To be specific, the conductive material C1 may be copper (Cu), titanium (Ti), tantalum (Ta), tungsten (W), or a combination of aforementioned metals and metal compounds but not limited herein. The conductive material C1 may be filled into the blind holes H1 through a plating process or a deposition process. The blind holes H1 can be completely or partially filled with the conductive material C1 as long as an electrical connection is achieved. After that, metal on the surface S1 is removed through a polishing process or an etching process to form the conductive pillars 110a.

Thereby, in the present embodiment, the interposer substrate 110 is fabricated by using the thermosetting material M1 (for example, EMC), and the shape and thickness of the interposer substrate 110 and the positions and depth of the blind holes H1 are determined according to the actual requirement and through the mould 50. To be specific, in the present embodiment, the mould 50 (as shown in FIG. 2A) with the protrusions 54 (or the protrusions 54a in FIG. 3) is designed, and the thermosetting material M1 is injected into the chamber 52 and cured. The cured thermosetting material M2 is then separated from the mould 50 to form the interposer substrate 110 with the blind holes H1. The shape and thickness of the interposer substrate 110 and the positions and depth of the blind holes H1 are corresponding to the shape and thickness of the chamber 52 and the shape and thickness of the protrusions 54. Thereafter, the conductive material C1 is filled into the blind holes H1 through a plating or deposition process, so as to form the conductive pillars 110a through a polishing process or an etching process. It should be noted that the thickness of the interposer substrate 110 and the depth of the blind holes H1 in FIG. 2D can be determined by the spacing D1 of the chamber 52 and the length D2 of the protrusions 54 in FIG. 2B and accordingly the manufacturing procedure can be simplified. Additionally, in the semiconductor device manufacturing method provided by the present embodiment, the blind holes need not to be formed through any etching or laser process, so that the manufacturing cost of the interposer substrate 110 is reduced.

Figure 2F:
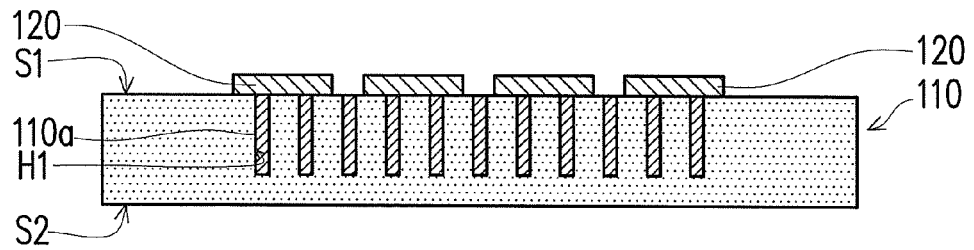
Figure 2G:
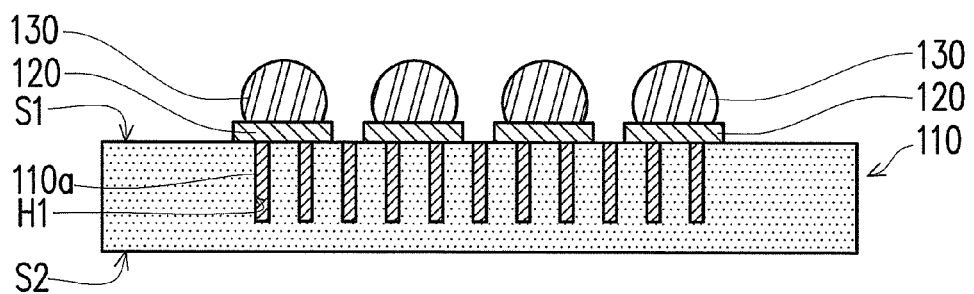
Figure 2H:
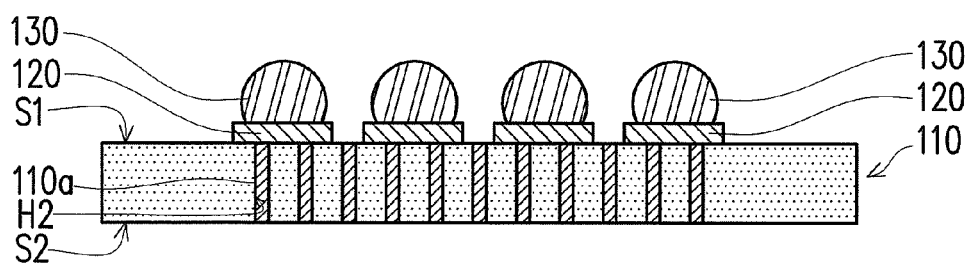

Next, referring to FIG. 2F, a first conductive pattern layer 120 is formed on the first surface S1 of the interposer substrate 110, where the first conductive pattern layer 120 is a conductive wire structure and is electrically connected with the conductive pillars 110a (step S160). Referring to FIG. 2G, a plurality of first bumps 130 are formed on the first conductive pattern layer 120, where the first bumps 130 are electrically connected with the first conductive pattern layer 120. Referring to FIG. 2H again, a processing step is performed on the second surface S2 of the interposer substrate 110 to turn the blind holes H1 into a plurality of through holes H2. To be specific, in the processing step, the second surface S2 of the interposer substrate 110 may be polished, cut, or etched to expose the blind holes H1 and form the through holes H2.

Figure 2I:
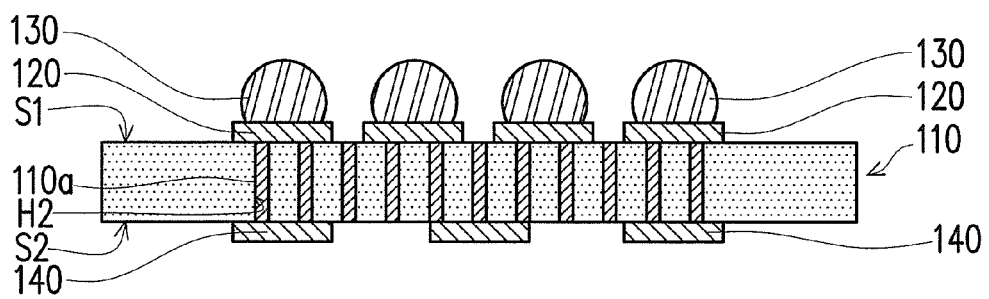
Figure 2J:
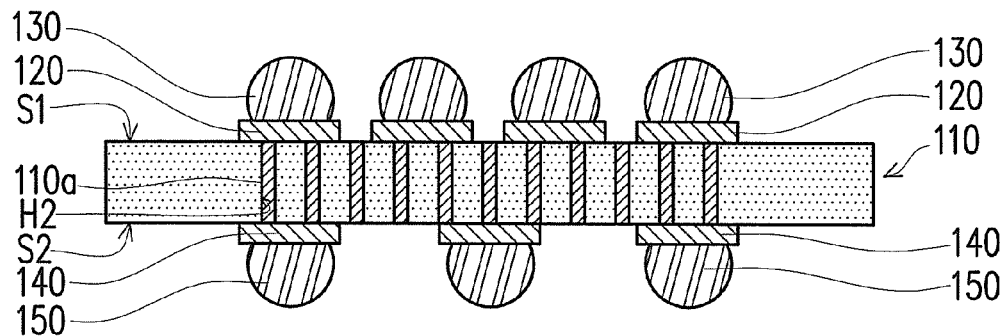

Thereafter, referring to FIG. 2I, a second conductive pattern layer 140 is formed on the second surface S2 of the interposer substrate 110, and the second conductive pattern layer 140 is a conductive wire structure and is electrically connected with the conductive pillars 110a. Referring to FIG. 2J, a plurality of second bumps 150 are formed on the second conductive pattern layer 140, and the second bumps 150 are electrically connected with the second conductive pattern layer 140.

Figure 2K:
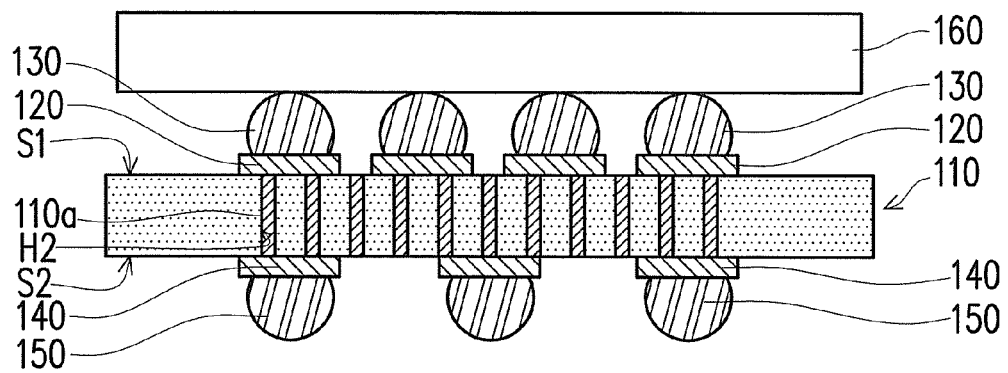
Figure 2L:
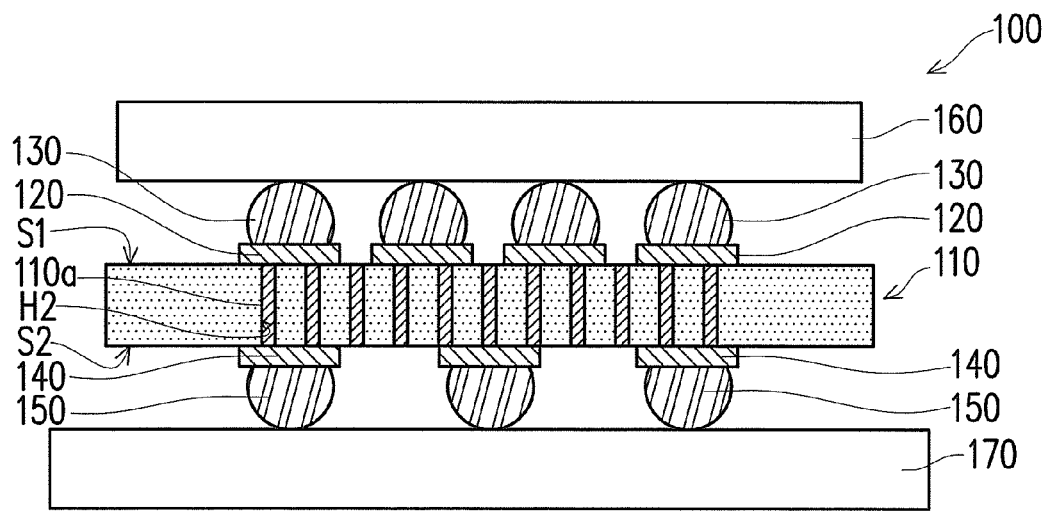

Next, referring to FIG. 2K, a chip 160 is stacked on the interposer substrate 110, and the chip 160 is electrically connected with the first conductive pattern layer 120 on the interposer substrate 110 through the first bumps 130. Referring to FIG. 2L, the chip 160 and the interposer substrate 110 are stacked on a substrate 170, and the substrate 170 is electrically connected with the second conductive pattern layer 140 of the interposer substrate 110 through the second bumps 150. In the present embodiment, the substrate 170 is an organic substrate made of an organic material. However, the present disclosure is not limited thereto. By now, the manufacturing procedure of a semiconductor device 100 is completed.

It should be noted that in the present embodiment, the shape and thickness of the interposer substrate 110 and the positions and depth of the blind holes H1 can be defined according to the actual requirement and through the mould 50. In the present embodiment, as shown in FIG. 2B, the spacing D1 of the chamber 52 is approximately smaller than 5 mm, and the length D2 of the protrusions 54 is smaller than the spacing D1 of the chamber 52. Thus, the thickness of the interposer substrate 110 manufactured through foregoing steps S110-S140 by using the mould 50 is approximately smaller than 5 mm (i.e., corresponding to the spacing D1 of the chamber 52 in FIG. 2B), where the positions of the blind holes H1 are corresponding to the positions of the protrusions 54 in FIG. 2B, and the depth of the blind holes H1 is the length D2 of the protrusions 54 and is smaller than the spacing D1 of the chamber 52. In addition, the thickness of the chip 160 is about 0.7 mm (the chip 160 may be worn thin according to the requirement and the thickness thereof may be smaller than 0.7 mm), and the thickness of the substrate 170 is about 1-2 mm.

Figure 4A:
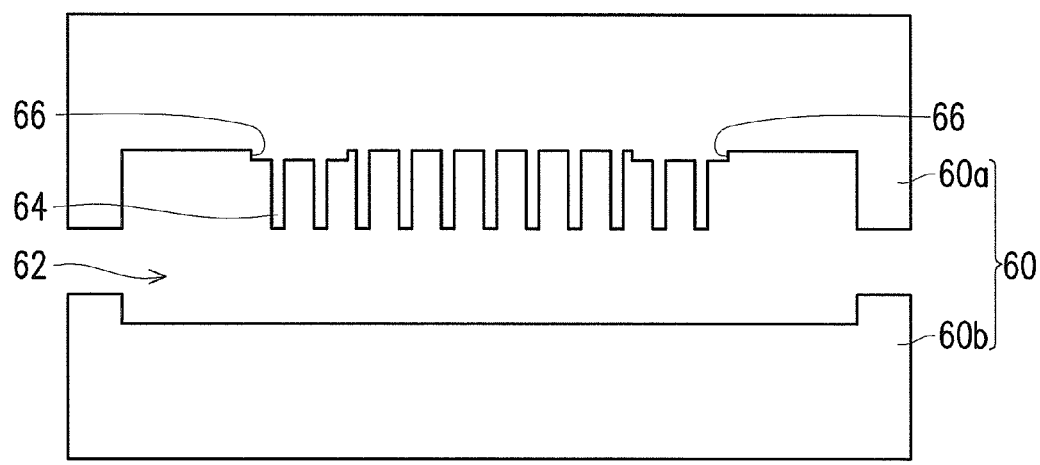
FIGS. 4A-4H are diagrams illustrating the manufacturing method of a semiconductor device in FIG. 1 according to another embodiment of the present disclosure.
Figure 4B:
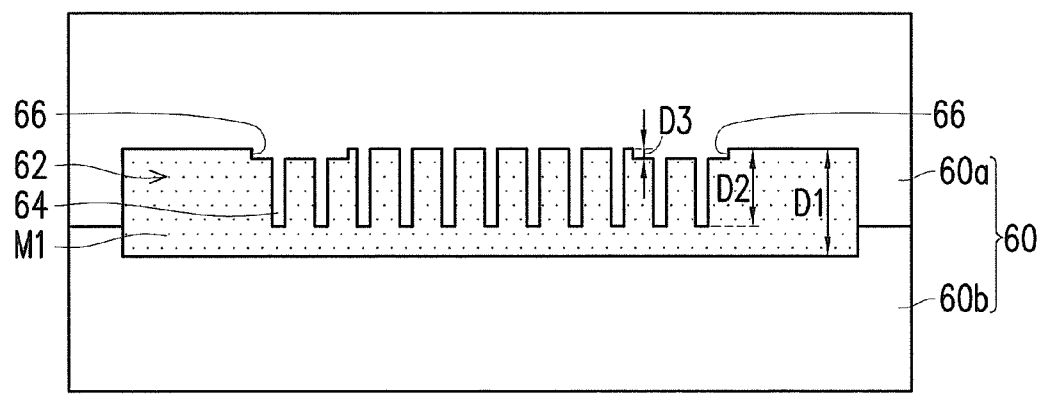

FIGS. 4A-4H are diagrams illustrating the semiconductor device manufacturing method in FIG. 1 according to another embodiment of the present disclosure. Referring to FIG. 1 and FIG. 4A first, a mould 60 is provided, and the mould 60 has a chamber 62 and a plurality of protrusions 64 in the chamber 62 (step S110). It should be noted that the mould 60 in FIG. 4A is similar to the mould 50 in FIG. 2A, and the difference between the two is that the chamber 62 of the mould 60 further has a plurality of patterns 66, and parts of the protrusions 64 are connected with the patterns 66. In other embodiments, the patterns exist in the chamber independently. To be specific, the chamber 62 is composed of a top cover 60a and a bottom cover 60b, and the spacing of the chamber 62 is D1 (as shown in FIG. 4B). In the present embodiment, the spacing D1 of the chamber 62 is approximately smaller than 5 mm.

In the present embodiment, the mould 60, the protrusions 64, and the patterns 66 are integrally formed and made of the same material. For example, the mould 60, the protrusions 64, and the patterns 66 are made of a tungsten alloy. However, the mould 60 may also be made through the same procedure as the mould 50 illustrated in FIG. 3. Namely, the mould 60, the protrusions 64, and the patterns 66 may be made of different materials. For example, the protrusions 64 and the patterns 66 are made of silicon or a tungsten alloy and formed on the top cover 60a of the mould 60, while the mould 60 is made of a metal material different from that of the protrusions 64.

In the present embodiment, the length of the protrusions 64 is D2, and the length of the patterns 66 is D3, as shown in FIG. 4B. However, the spacing of the chamber, the length of the protrusions, and the length of the patterns are not limited in the present disclosure and can be adjusted according to the actual requirement. The patterns 66 are served according to the design requirement as an interconnection layer for connecting the protrusions 64. In addition, in the present embodiment, the length D3 of the patterns 66 is smaller than the length of the protrusions 64, and the length D2 of the protrusions 64 is smaller than the spacing D1 of the chamber 52.

Figure 4C:
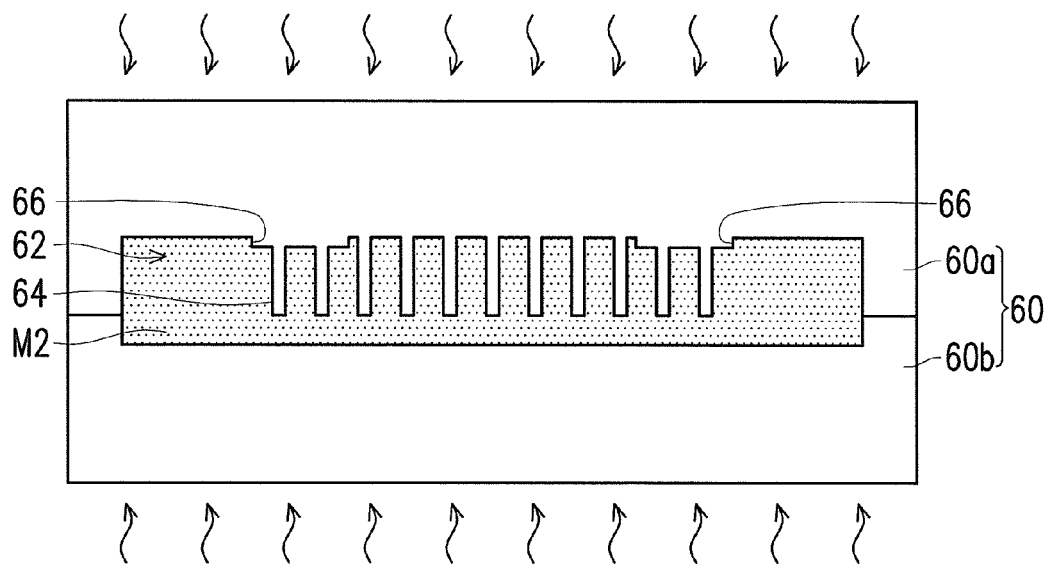

Referring to FIG. 4B again, a thermosetting material M1 is injected into the chamber 62 (step S120). In the present embodiment, the thermosetting material M1 is an insulator, such as EMC, PI, silicon resin, PU, or a compound of one of aforementioned material with a filler, a hardener, a coupling agent, or any other additive agent. Referring to FIG. 4C, the thermosetting material M1 is cured (step S130) and turned into a cured thermosetting material M2.

Figure 4D:
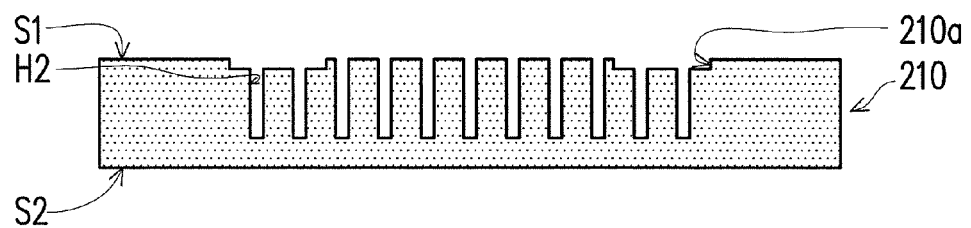

Next, referring to FIG. 4D, a parting step is performed to separate the cured thermosetting material M2 from the mould 60 to form an interposer substrate 210, wherein a plurality of blind holes H1 corresponding to the protrusions 64 are formed on the interposer substrate 210 (step S140). After the parting step S140, a plurality of grooves 210a corresponding to the patterns 66 are formed on the interposer substrate 210, where a part of the blind holes H1 are connected with the grooves 210a.

Figure 4E:
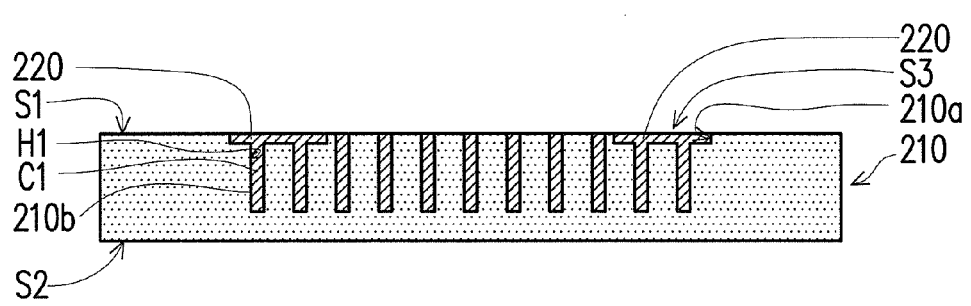

Referring to FIG. 4E, a conductive material C1 is filled into the blind holes H1 to form a plurality of conductive pillars 210b (step S150). Meanwhile, the conductive material C1 is filled into the grooves 210a to form a first conductive pattern layer 220 electrically connected with the conductive pillars 210b, where the first conductive pattern layer 220 is a conductive wire structure, and the surface S3 of the first conductive pattern layer 220 and the first surface S1 of the interposer substrate 210 are coplanar. To be specific, the conductive material C1 may be Cu, Ti, Ta, W, or a combination of aforementioned metals and metal compounds but not limited herein. The conductive material C1 may be filled into the blind holes H1 and the grooves 210a through a plating process or a deposition process. The blind holes H1 and the grooves 210a can be completely or partially filled with the conductive material C1 as long as an electrical connection is achieved. After that, metal on the surface S1 is removed through a polishing process or an etching process to respectively form the conductive pillars 210b and the first conductive pattern layer 220.

Thereby, in the present embodiment, the interposer substrate 210 is fabricated by using the thermosetting material M1 (for example, EMC), and the shape and thickness of the interposer substrate 210, the positions and depth of the blind holes H1, and the positions and depth of the grooves 210a are determined according to the actual requirement and through the mould 60. To be specific, in the present embodiment, the mould 60 (as shown in FIG. 4A) with the protrusions 64 and the patterns 66 is designed, and the thermosetting material M1 is injected into the chamber 62 and cured. The cured thermosetting material M2 is then separated from the mould 60 to form the interposer substrate 210 with the blind holes H1 and the grooves 210a. The shape and thickness of the interposer substrate 210, the positions and depth of the blind holes H1, and the positions and depth of the grooves 210a are respectively corresponding to the shape and thickness of the chamber 62, the shape and thickness of the protrusions 64, and the shape and thickness of the patterns 66. Thereafter, the conductive material C1 is filled into the blind holes H1 and the grooves 210a through a plating or deposition process, so as to form the conductive pillars 210b and the first conductive pattern layer 220.

It should be noted that the thickness of the interposer substrate 210, the depth of the blind holes H1, and the depth of the grooves 210a as shown in FIG. 4D can be determined by the spacing D1 of the chamber 62, the length D2 of the protrusions 64, and the length D3 of the patterns 66 as shown in FIG. 4B. To be specific, as shown in FIG. 4B, the spacing D1 of the chamber 62 is approximately smaller than 5 mm. Besides, the length D3 of the patterns 66 is smaller than the length D2 of the protrusions 64, and the length D2 of the protrusions 64 is smaller than the spacing D1 of the chamber 52. Thus, the thickness of the interposer substrate 210 fabricated by using the mould 60 is approximately smaller than 5 mm (i.e., corresponding to the spacing D1 of the chamber 62 in FIG. 4B), where the positions of the blind holes H1 and the positions of the grooves 210a are respectively corresponding to the positions of the protrusions 64 and the positions of the patterns 66 in FIG. 4B, the depth of the blind holes H1 is corresponding to the length D2 of the protrusions 64, and the depth of the grooves 210a is corresponding to the length D3 of the patterns 66. Thereby, in the manufacturing method provided by the present embodiment, the interposer substrate 210 having both the blind holes H1 and the grooves 210a can be fabricated, and the shape and thickness of the interposer substrate 210, the depth of the blind holes H1, and the depth of the grooves 210a can be determined according to the actual design requirement and through the mould 60. Additionally, in the semiconductor device manufacturing method provided by the present embodiment, the blind holes and the grooves need not to be formed through any etching or laser process, and the blind holes H1 need not to be filled through any plating or deposition process to form the conductive pillars 210b or the first conductive pattern layer 220, so that the manufacturing procedure is simplified and the manufacturing cost of the interposer substrate 210 is reduced.

Figure 4F:
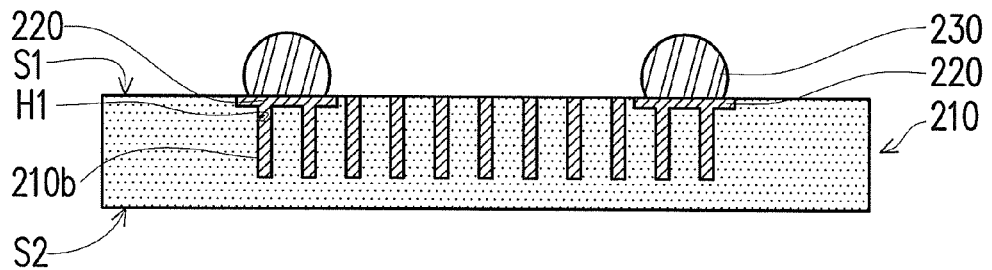
Figure 4G:
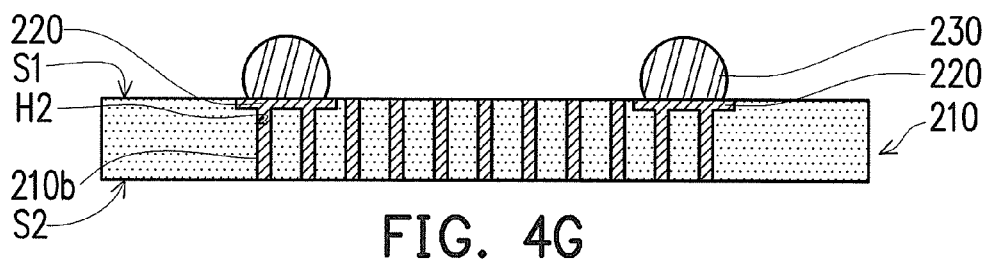

Next, referring to FIG. 4F, a plurality of first bumps 230 are formed on the first conductive pattern layer 220, where the first bumps 230 are electrically connected with the first conductive pattern layer 220. Referring to FIG. 4G, a processing step is performed on the second surface S2 of the interposer substrate 210 to turn the blind holes H1 into a plurality of through holes H2. To be specific, in the processing step, the second surface S2 of the interposer substrate 210 is polished, cut, or etched to expose the blind holes H1 and form the through holes H2.

Figure 4H:
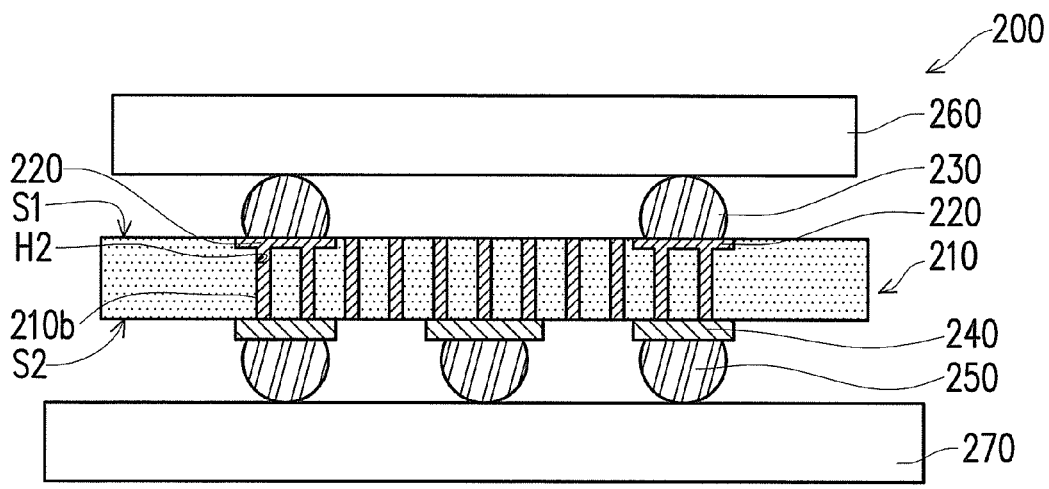

Referring to FIG. 4H, a second conductive pattern layer 240 is formed on the second surface S2 of the interposer substrate 210, and a plurality of second bumps 250 electrically connected with the second conductive pattern layer 240 are formed on the second conductive pattern layer 240, where the second conductive pattern layer 240 is a conductive wire structure and is electrically connected with the conductive pillars 210b.

Thereafter, a chip 260 and the interposer substrate 210 are stacked on a substrate 270, where the substrate 270 may be an organic substrate made of an organic material, and the chip 260 and the substrate 270 are electrically connected with the first conductive pattern layer 220 and the second conductive pattern layer 240 on the interposer substrate 210 respectively through the first bumps 230 and the second bumps 250. By now, the manufacturing procedure of a semiconductor device 200 is completed. It should be noted that the steps of the semiconductor device manufacturing method illustrated in FIG. 4H can be performed to sequentially form the second conductive pattern layer 240, the second bumps 250, the chip 260, and the substrate 270 by referring to the steps illustrated in FIGS. 2I-2L.

Figure 5A:
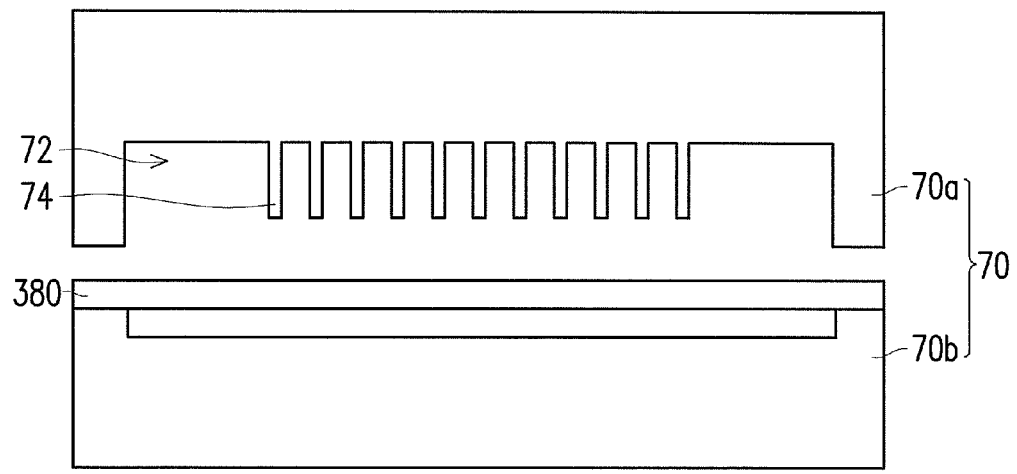
FIGS. 5A-5I are diagrams illustrating the manufacturing method of a semiconductor device in FIG. 1 according to yet another embodiment of the present disclosure.
Figure 5B:
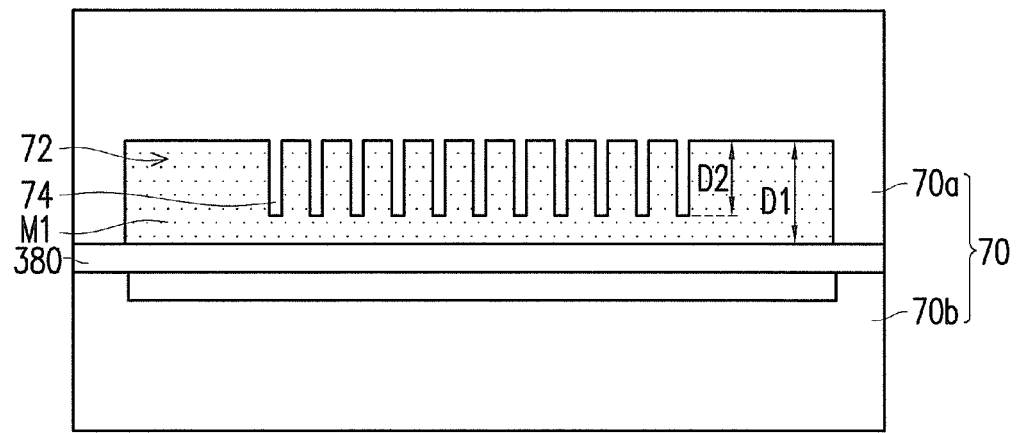
Figure 5C:
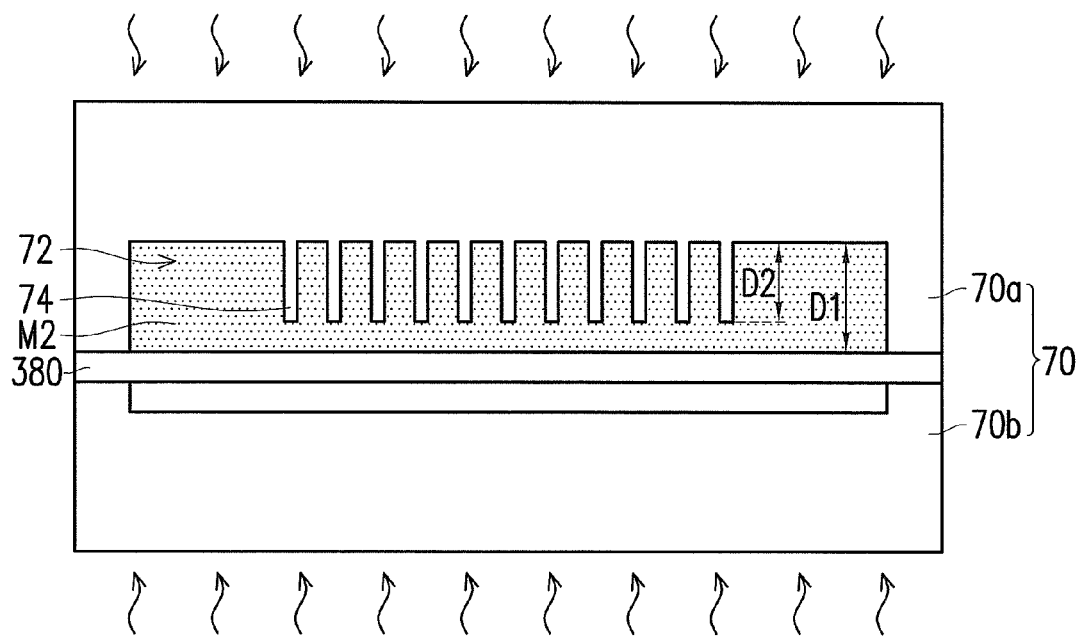

FIGS. 5A-5I are diagrams illustrating the semiconductor device manufacturing method in FIG. 1 according to yet another embodiment of the present disclosure. Referring to FIG. 1 and FIG. 5A first, a mould 70 is provided, where the mould 70 has a chamber 72 and a plurality of protrusions 74 in the chamber 72 (step S110). To be specific, the chamber 72 is composed of a top cover 70a and a bottom cover 70b, and the spacing of the chamber 72 is D1 (as shown in FIG. 5B, and the spacing D1 does not include the carrier substrate 380 in FIG. 5B). In the present embodiment, the spacing D1 of the chamber 72 is approximately smaller than 5 mm.

In the present embodiment, the mould 70 and the protrusions 74 are integrally formed and made of the same material. For example, the mould 70 and the protrusions 74 are made of tungsten alloy. However, the mould 70 may also adopt the mould 50 illustrated in FIG. 3. In this case, the mould 70 and the protrusions 74 are made of different materials. For example, the protrusions 74 are made of silicon or tungsten alloy and formed on the top cover 70a of the mould 70, while the mould 70 is made of a metal material different from that of the protrusions 74.

The length of the protrusions 74 is D2, as shown in FIG. 5B. However, the spacing of the chamber and the length of the protrusions are not limited in the present disclosure and can be adjusted according to the actual requirement. Besides, in the present embodiment, the length D2 of the protrusions 74 is smaller than the spacing D1 of the chamber 72.

Step S110 in the semiconductor device manufacturing method illustrated FIG. 5A is similar to that in the semiconductor device manufacturing method illustrated in FIG. 2A, and the difference is that in the present embodiment, the carrier substrate 380 is disposed in the chamber 72 and leaned against the bottom cover 70b, where the carrier substrate 380 may be made be made of silicon or glass and may be a wafer or in any other pattern suitable for subsequent manufacturing process.

Referring to FIG. 5B, a thermosetting material M1 is injected into the chamber 52 (step S120). In the present embodiment, the thermosetting material M1 is an insulator, such as EMC, PI, silicon resin, PU, or a compound of one of aforementioned material with a filler, a hardener, a coupling agent, or any other additive agent. Next, referring to FIG. 5C, the thermosetting material M1 is cured (step S130) and turned into a cured thermosetting material M2.

Figure 5D:
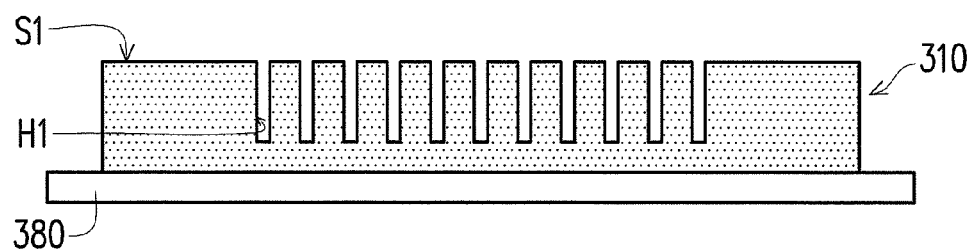

Thereafter, referring to FIG. 5D, a parting step is performed to separate the cured thermosetting material M2 from the mould 70, so as to form an interposer substrate 310, where a plurality of blind holes H1 corresponding to the protrusions 74 are formed on the interposer substrate 310 (step S140). After the parting step S140, the interposer substrate 310 is carried by the carrier substrate 380.

Figure 5E:
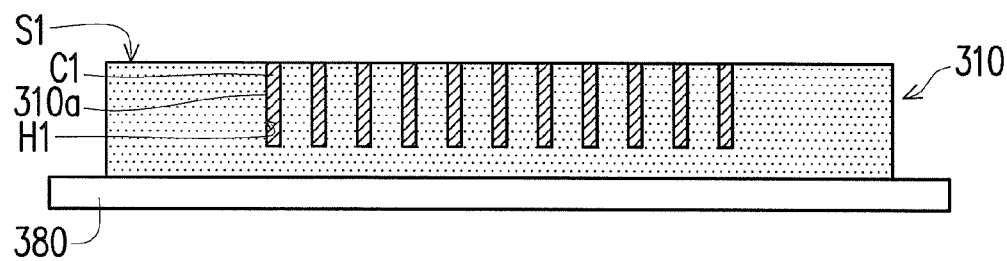

Referring to FIG. 5E, a conductive material C1 is filled into the blind holes H1 to form a plurality of conductive pillars 310a (step S150). To be specific, the conductive material C1 may be Cu, Ti, Ta, W, or a combination of aforementioned metals and metal compounds but not limited herein. The conductive material C1 may be filled into the blind holes H1 through a plating process or a deposition process. The blind holes H1 can be completely or partially filled with the conductive material C1 as long as an electrical connection is achieved. After that, metal on the surface S1 is removed through a polishing process or an etching process to form the conductive pillars 310a.

Thereby, in the present embodiment, the interposer substrate 310 is fabricated by using the thermosetting material M1 (for example, EMC), and the shape and thickness of the interposer substrate 310 and the positions and depth of the blind holes H1 are determined according to the actual requirement and through the mould 70. To be specific, in the present embodiment, the mould 70 with the protrusions 74 (as shown in FIG. 5A) is designed, and the carrier substrate 380 is disposed in the chamber 72, so as to fabricate the interposer substrate 310 on the carrier substrate 380. After that, the thermosetting material M1 is cured in the chamber 72 and separated from the mould 70 to form the interposer substrate 310 with the blind holes H1. Next, the conductive material C1 is filled into the blind holes H1 through a plating or deposition process to form the conductive pillars 310a. It should be noted that the thickness of the interposer substrate 310 and the depth of the blind holes H1 can be determined by the spacing D1 of the chamber 72 and the length D2 of the protrusions 74 (as shown in FIG. 5B), so that the manufacturing procedure can be simplified. Additionally, in the semiconductor device manufacturing method provided by the present embodiment, the blind holes need not to be formed through any etching or laser process, so that the manufacturing cost of the interposer substrate 310 is reduced.

Figure 5F:
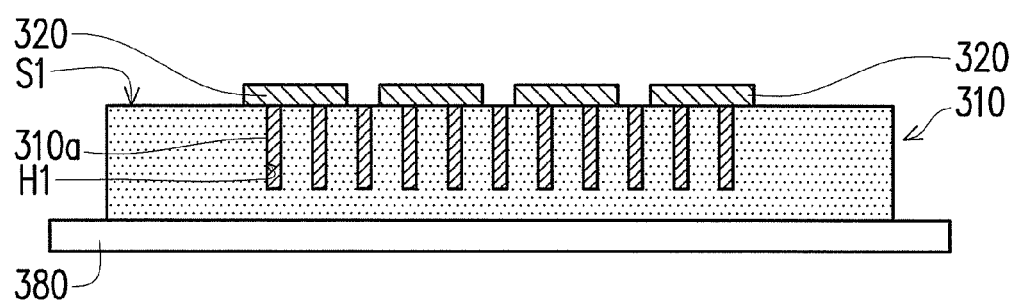
Figure 5G:
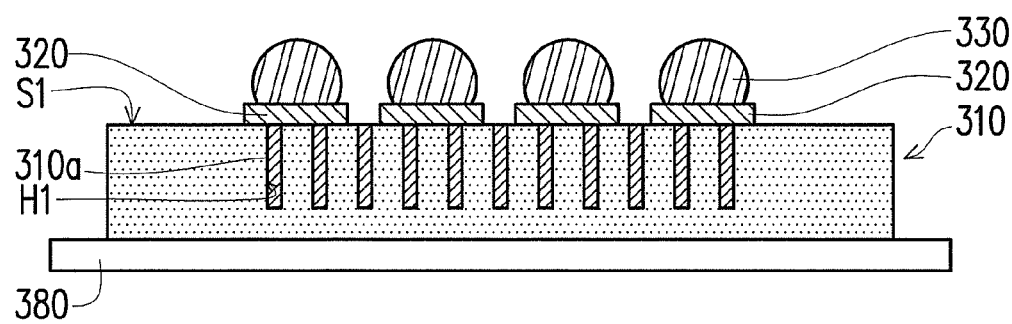
Figure 5H:
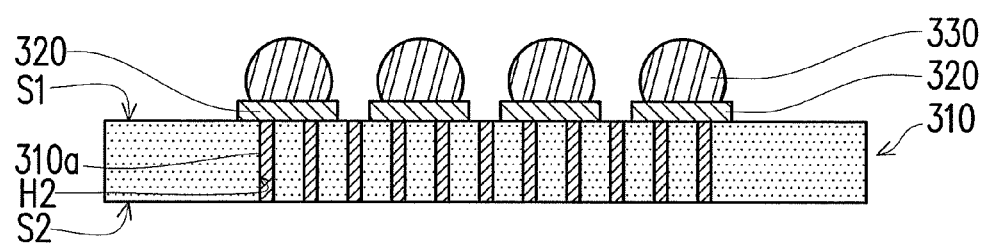

Next, referring to FIG. 5F, a first conductive pattern layer 320 is formed on the first surface S1 of the interposer substrate 310, where the first conductive pattern layer 320 is a conductive wire structure and is electrically connected with the conductive pillars 310a (step S160). Referring to FIG. 5G, a plurality of first bumps 330 are formed on the first conductive pattern layer 320, where the first bumps 330 is electrically connected with the first conductive pattern layer 320. Referring to FIG. 5H, the carrier substrate 380 is removed, and a processing step is performed on the second surface S2 of the interposer substrate 310 to turn the blind holes H1 into a plurality of through holes H2. To be specific, in the processing step, the second surface S2 of the interposer substrate 310 is polished, cut, or etched to expose the blind holes H1 and form the through holes H2.

Figure 5I:
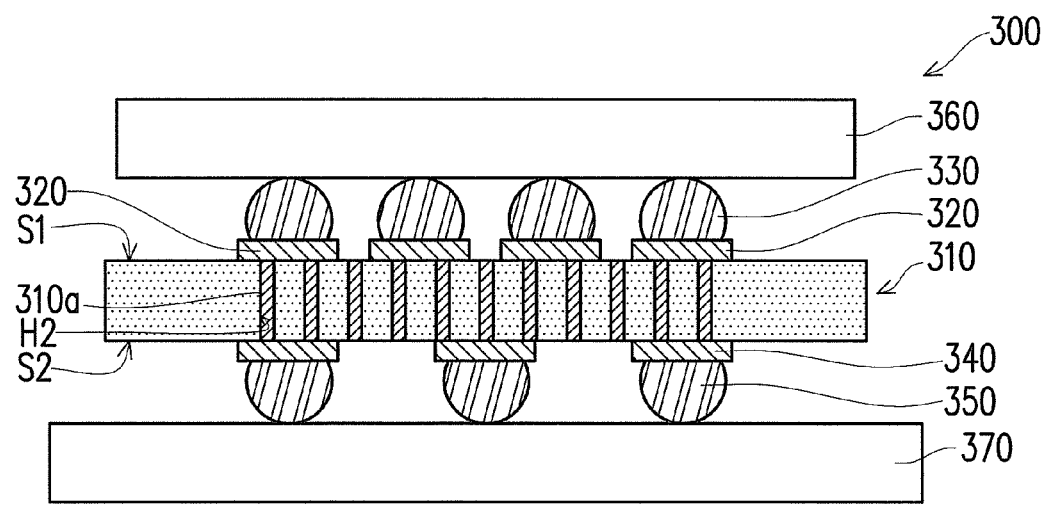

Referring to FIG. 5I, a second conductive pattern layer 340 is formed on the second surface S2 of the interposer substrate 310, and a plurality of second bumps 350 electrically connected with the second conductive pattern layer 340 are formed on the second conductive pattern layer 340, where the second conductive pattern layer 340 is a conductive wire structure and is electrically connected with the conductive pillars 310a.

Additionally, a chip 360 and the interposer substrate 310 are stacked on a substrate 370, where the substrate 370 is an organic substrate made of an organic material, and the chip 360 and the substrate 370 are electrically connected with the first conductive pattern layer 320 and the second conductive pattern layer 340 on the interposer substrate 310 respectively through the first bumps 330 and the second bumps 350. By now, the manufacturing procedure of a semiconductor device 300 is completed. It should be noted that the steps of the semiconductor device manufacturing method illustrated in FIG. 5I can be performed to sequentially fabricate the second conductive pattern layer 340, the second bumps 350, the chip 360, and the substrate 370 by referring to the steps illustrated in FIGS. 2I-2L.

Figure 6A:
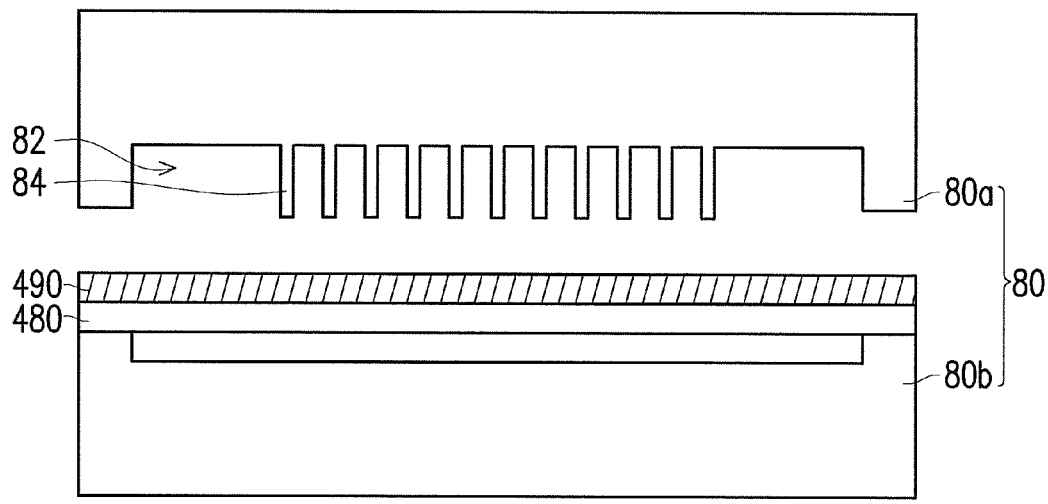
FIGS. 6A-6I are diagrams illustrating the manufacturing method of a semiconductor device in FIG. 1 according to still another embodiment of the present disclosure.
Figure 6B:
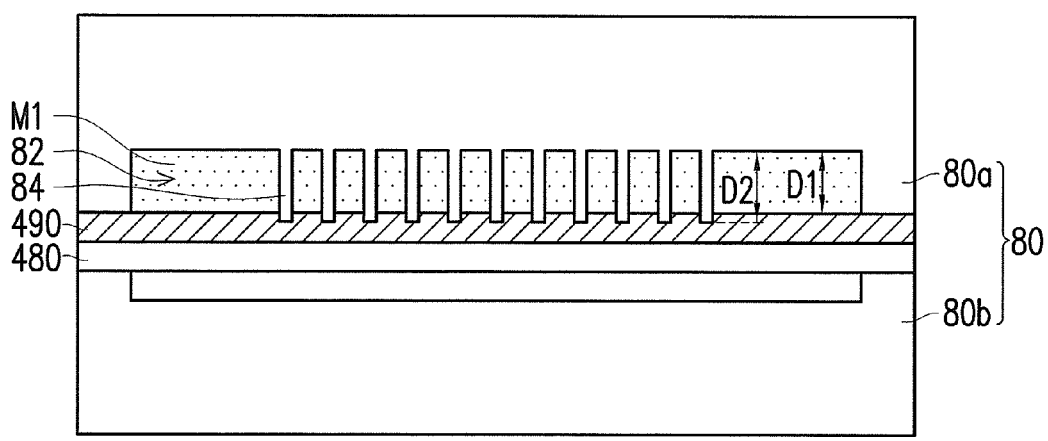

FIGS. 6A-6I are diagrams illustrating the semiconductor device manufacturing method in FIG. 1 according to still another embodiment of the present disclosure. Referring to FIG. 1 and FIG. 6A first, a mould 80 is provided, where the mould 80 has a chamber 82 and a plurality of protrusions 84 in the chamber 82 (step S110). To be specific, the chamber 82 is composed of a top cover 80a and a bottom cover 80b, and the spacing of the chamber 82 is D1 (as shown in FIG. 6B, and the spacing D1 does not include the carrier substrate 480 and the buffer layer 490 in FIG. 6B). In the present embodiment, the spacing D1 of the chamber 82 is approximately smaller than 5 mm.

It should be noted that the mould 80 in FIG. 6A is similar to the mould 70 in FIG. 5A. Accordingly, the mould 80 and the protrusions 84 are integrally formed by using the same material. For example, the mould 80 and the protrusions 84 are made of tungsten alloy. However, the mould 80 may also adopt the mould 50 illustrated in FIG. 3. In this case, the mould 80 and the protrusions 84 are made of different materials. For example, the protrusions 84 are made of silicon or tungsten alloy and are formed on the top cover 80a of the mould 80, while the mould 80 is made of a metal material different from that of the protrusions 84.

The length of the protrusions 84 is D2, as shown in FIG. 6B. However, the spacing of the chamber and the length of the protrusions are not limited in the present disclosure and can be adjusted according to the actual requirement.

Step S110 of the semiconductor device manufacturing method illustrated in FIG. 6A is similar to that in the semiconductor device manufacturing method illustrated in FIG. 5A, and the difference is that in the present embodiment, a buffer layer 490 is formed on a carrier substrate 480, where the protrusions 84 of the mould 80 are inserted into the buffer layer 490. The buffer layer 490 is made of benzocyclobutene (BCB), silicon dioxide, or a polymeric compound, while the material of the carrier substrate 480 can be referred to that of the carrier substrate 380 illustrated in FIG. 5A and will not be described herein.

Figure 6C:
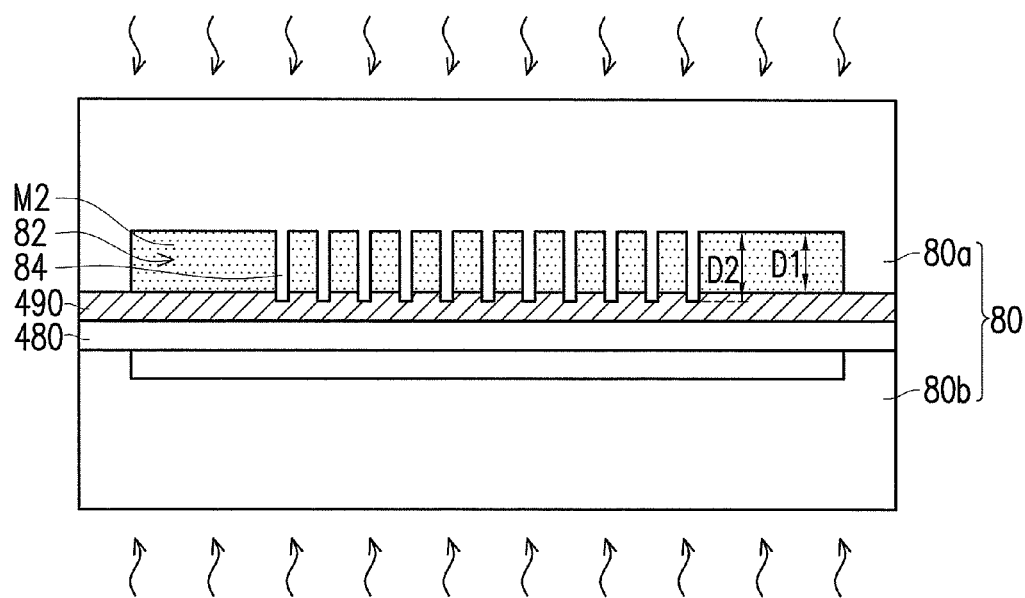

Referring to FIG. 6B, a thermosetting material M1 is injected into the chamber 82 (step S120). In the present embodiment, the thermosetting material M1 is an insulator, such as EMC, PI, silicon resin, PU, or a compound of one of aforementioned material with a filler, a hardener, a coupling agent, or any other additive agent. Referring to FIG. 6C, the thermosetting material M1 is cured (step S130) and turned into a cured thermosetting material M2.

Figure 6D:
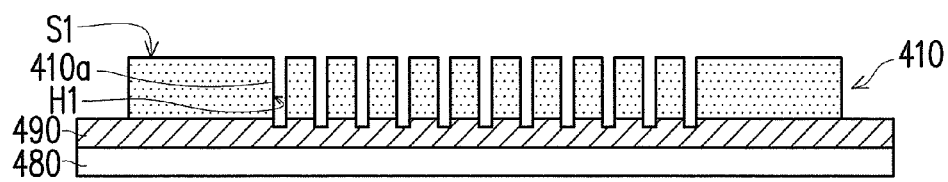

Next, referring to FIG. 6D, a parting step is performed to separate the cured thermosetting material M2 from the mould 80, so as to form an interposer substrate 410, where a plurality of blind holes H1 corresponding to the protrusions 84 are formed on the interposer substrate 410 (step S140). Additionally, the interposer substrate 410 is carried by the carrier substrate 480, and the blind holes H1 penetrate the buffer layer 490.

Figure 6E:
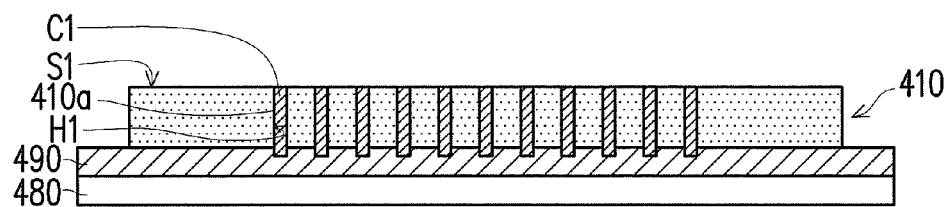

Referring to FIG. 6E, a conductive material C1 is filled into the blind holes H1 to form a plurality of conductive pillars 410a (step S150), and the conductive pillars 410a are inserted into the buffer layer 490. To be specific, the conductive material C1 may be Cu, Ti, Ta, W, or a combination of aforementioned metals and metal compounds but not limited herein. The conductive material C1 may be filled into the blind holes H1 through a plating process or a deposition process. The blind holes H1 can be completely or partially filled with the conductive material C1 as long as an electrical connection is achieved. After that, metal on the surface S1 is removed through a polishing process or an etching process to form the conductive pillars 410a and allow the blind holes and the conductive pillars 410a to penetrate the buffer layer 490.

Figure 6F:
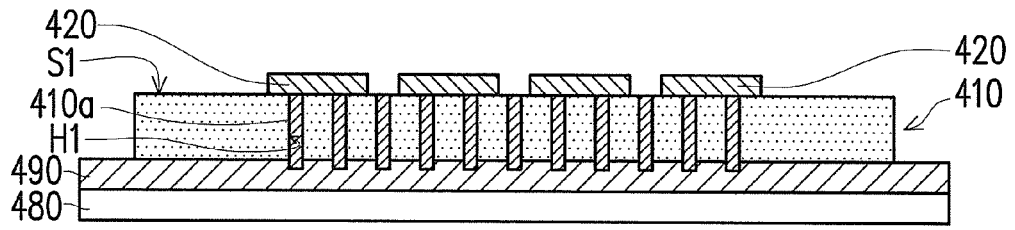
Figure 6G:
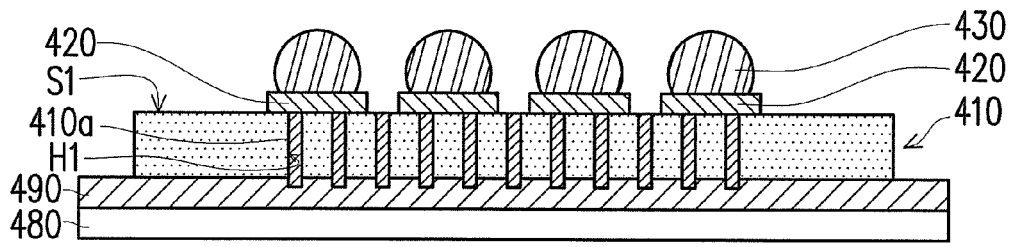
Figure 6H:
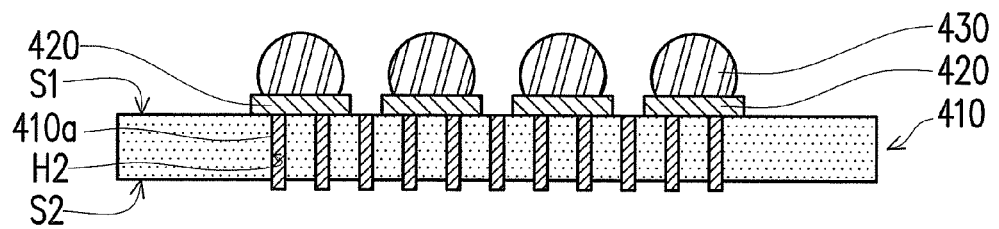

Thereafter, referring to FIG. 6F, a first conductive pattern layer 420 is formed on the first surface S1 of the interposer substrate 410, where the first conductive pattern layer 420 is a conductive wire structure and is electrically connected with the conductive pillars 410a (step S160). Referring to FIG. 6G, a plurality of first bumps 430 are formed on the first conductive pattern layer 420, where the first bumps 430 are electrically connected with the first conductive pattern layer 420. Referring to FIG. 6H, the carrier substrate 480 and the buffer layer 490 are removed to allow the conductive pillars 410a to protrude from the interposer substrate 410. To be specific, in the processing step, the second surface S2 of the interposer substrate 410 and the blind holes H1 can be exposed to form the through holes H2 without going through any polishing, cutting, or etching process.

Thereby, in the present embodiment, the interposer substrate 410 is fabricated by using the thermosetting material M1 (for example, EMC), and the shape and thickness of the interposer substrate 410 and the positions and depth of the blind holes H1 can be determined according to the actual design requirement and through the mould 80. To be specific, in the present embodiment, the mould 80 with the protrusions 84 (as shown in FIG. 6A) is designed, and the carrier substrate 480 and the buffer layer 490 are sequentially disposed in the chamber 82, so as to form the interposer substrate 310 with the blind holes H1 on the carrier substrate 480 and the buffer layer 490, where the blind holes H1 penetrate the buffer layer 490. After that, the conductive material C1 is filled into the blind holes H1 to form the conductive pillars 410a. Next, after the carrier substrate 480 and the buffer layer 490 are removed, the conductive pillars 410a protrude from the interposer substrate 410 therefore can be served as bumps for achieving an electrical connection. However, similar to the embodiment described above (as shown in FIGS. 5A-5I), the thickness of the interposer substrate 410 and the depth of the blind holes H1 can be determined by the spacing D1 of the chamber 82 and the length D2 of the protrusions 84 in FIG. 6B. Thus, the manufacturing procedure can be simplified. Additionally, in the semiconductor device manufacturing method provided by the present embodiment, the blind holes H1 need not to be formed through any etching or laser process. Accordingly, the manufacturing cost of the interposer substrate 410 is reduced.

Figure 6I:
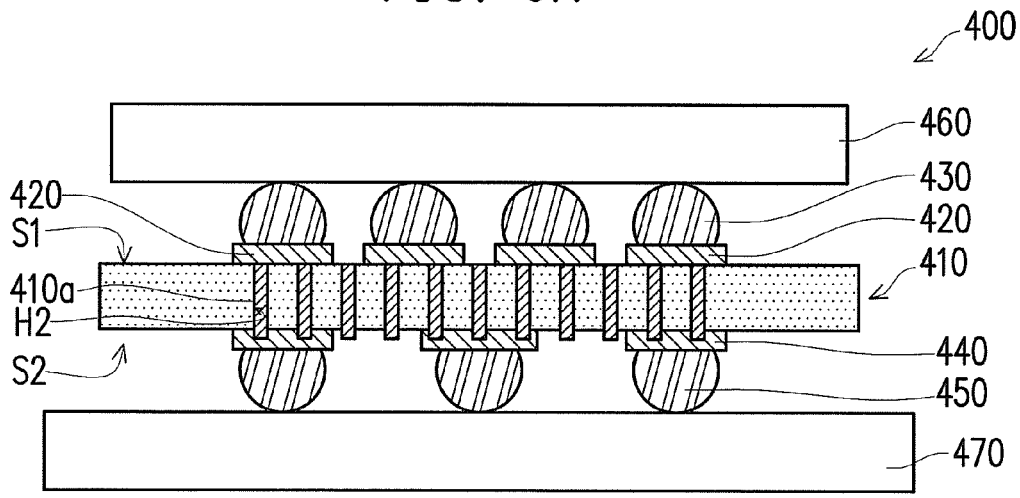

Referring to FIG. 6I, a second conductive pattern layer 440 is formed on the second surface S2 of the interposer substrate 410, and a plurality of second bumps 450 electrically connected with the second conductive pattern layer 440 are formed on the second conductive pattern layer 440, where the second conductive pattern layer 440 is a conductive wire structure and is electrically connected with the conductive pillars 410a.

After that, a chip 460 and the interposer substrate 410 are stacked on a substrate 470, where the substrate 470 is an organic substrate made of an organic material, and the chip 460 and the substrate 470 are electrically connected with the first conductive pattern layer 420 and the second conductive pattern layer 440 on the interposer substrate 410 respectively through the first bumps 430 and the second bumps 450. By now, the manufacturing procedure of a semiconductor device 400 is completed.

Figure 7:
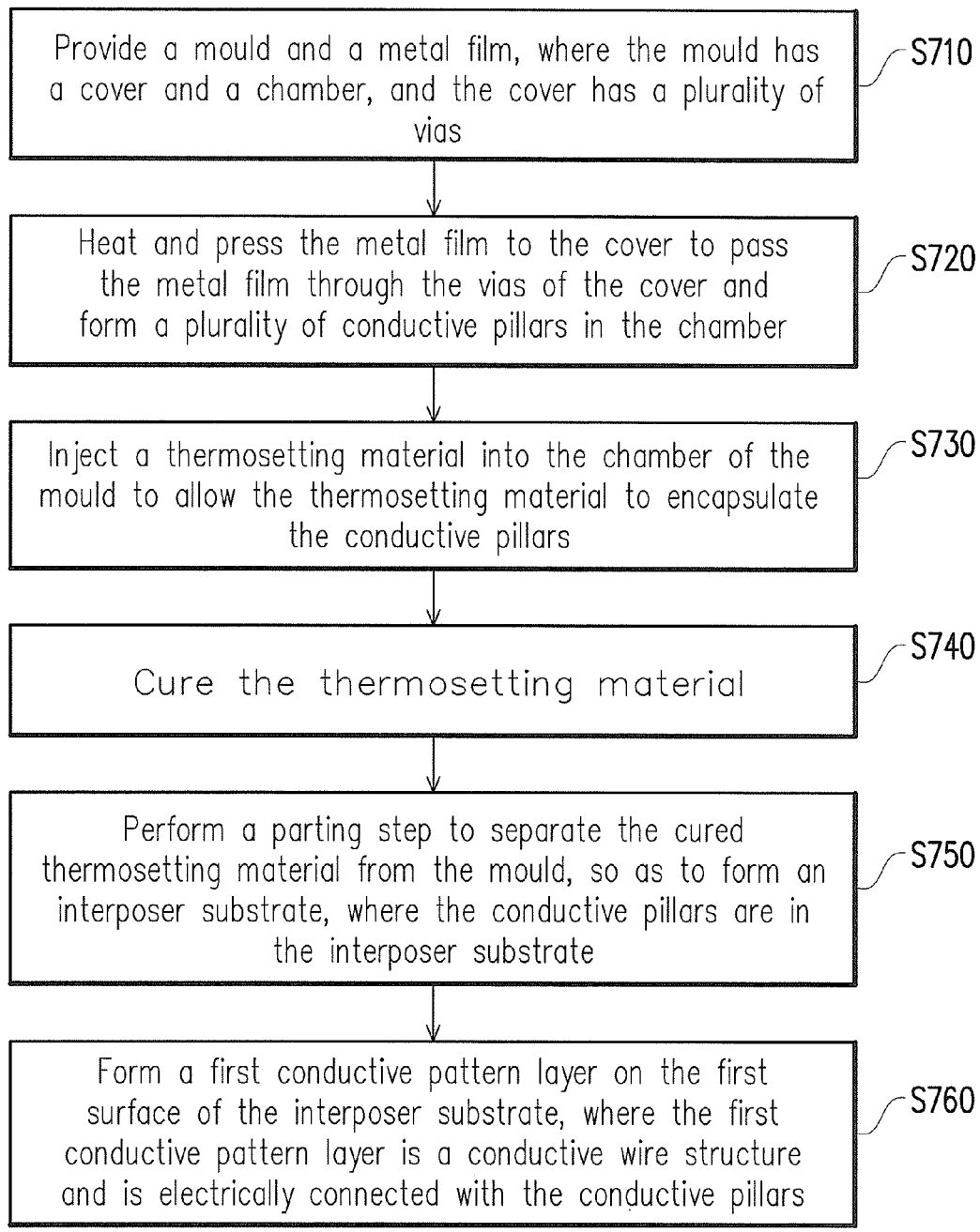
FIG. 7 is a flowchart of a manufacturing method of a semiconductor device according to another embodiment of the present disclosure.
Figure 8A:
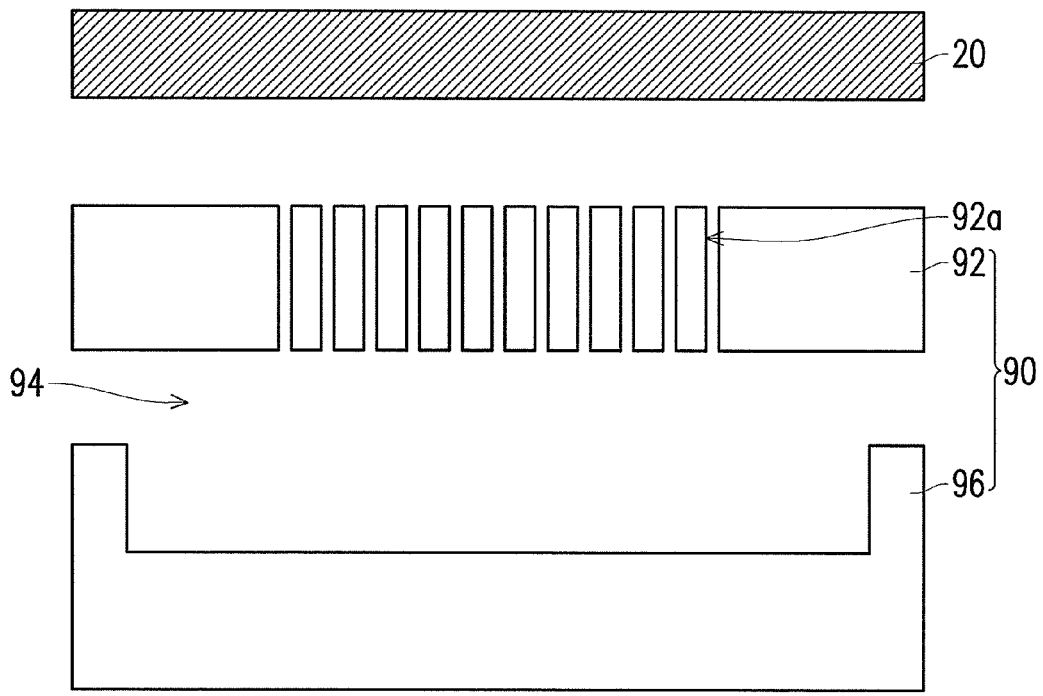
FIGS. 8A-8L are diagrams illustrating the manufacturing method of a semiconductor device in FIG. 7.

FIG. 7 is a flowchart of a manufacturing method of a semiconductor device according to another embodiment of the present disclosure. FIGS. 8A-8L are diagrams illustrating the semiconductor device manufacturing method in FIG. 7. Referring to FIG. 7 and FIG. 8A first, a mould 90 and a metal film 20 are provided, where the mould 90 has a cover 92 and a chamber 94, and the cover 92 has a plurality of vias 92a (step S710). To be specific, the chamber 94 is composed of the cover 92 and a bottom cover 96. In the present embodiment, the spacing of the chamber 94 is D1 (as shown in FIG. 8C) and is approximately smaller than 5 mm. The metal film 20 may be made of aluminium, copper, or gold.

Figure 8B:
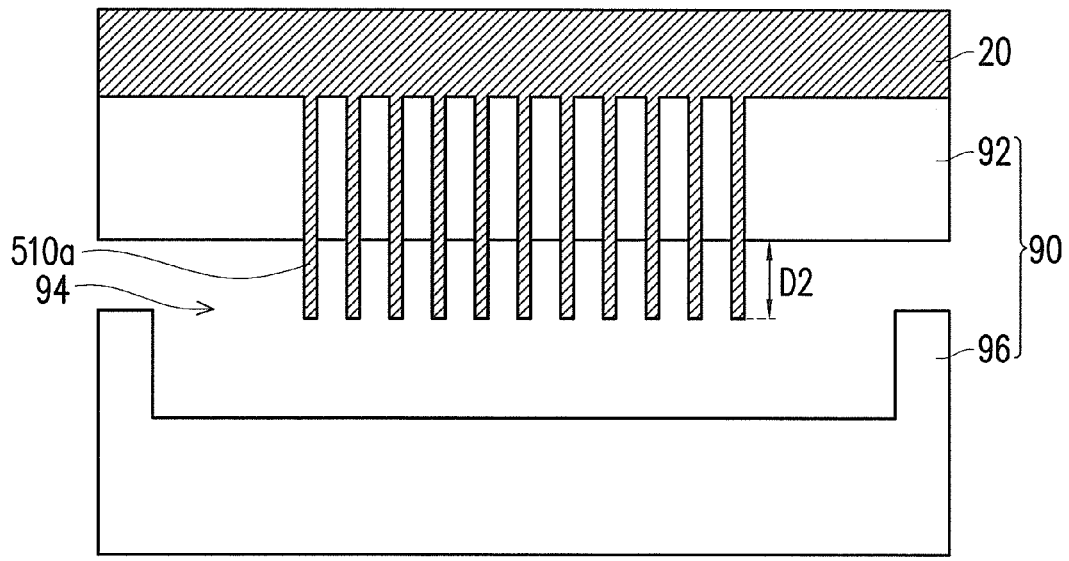
Figure 8C:
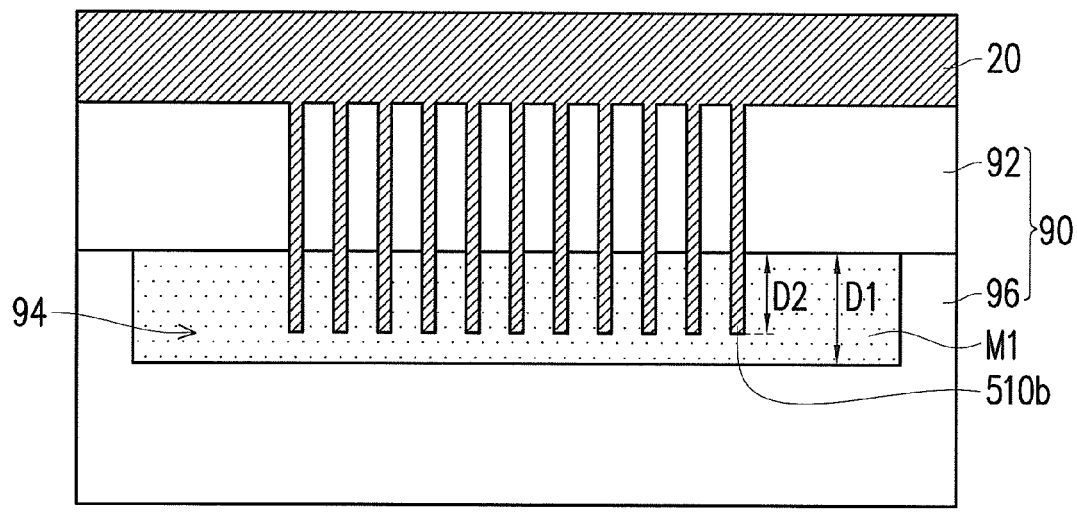

Referring to FIG. 8B, the metal film 20 is heated and pressed to the cover 92 to be passed through the vias 92a of the cover 92 and form a plurality of conductive pillars 510a in the chamber 94 (step S720), where the length (referring to the length of the parts of the conductive pillars 510a protruding from the cover 92) of the conductive pillars 510a is D2. Thereafter, the conductive pillars 510a are cooled down and cured to form a plurality of conductive pillars 510b.

Figure 8D:
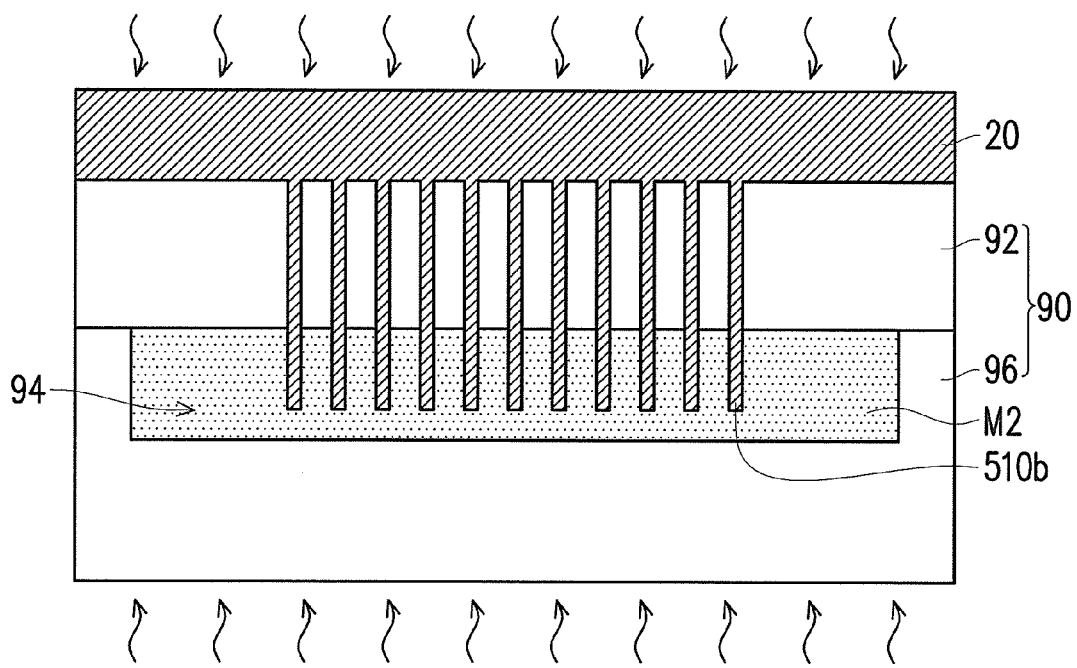

Next, referring to FIG. 8C, a thermosetting material M1 is injected into the chamber 94 of the mould 90 to allow the thermosetting material M1 to encapsulate the conductive pillars 510b (step S730). In the present embodiment, the thermosetting material M1 is an insulator, such as EMC, PI, silicon resin, PU, or a compound of one of aforementioned material with a filler, a hardener, a coupling agent, or any other additive agent. Referring to FIG. 8D, the thermosetting material M1 is cured (step S740) and turned into a cured thermosetting material M2.

Figure 8E:
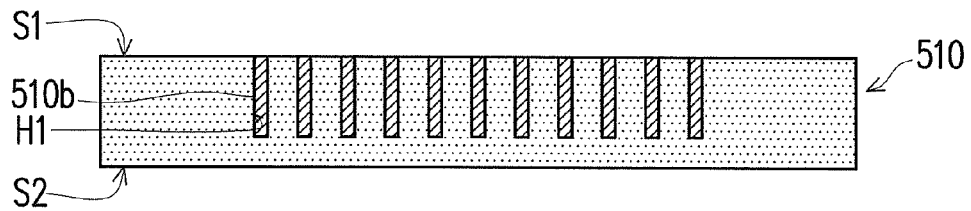

Next, referring to FIG. 8E, a parting step is performed to separate the cured thermosetting material M2 from the mould 90, so as to form an interposer substrate 510, where the conductive pillars 510b are in the interposer substrate 510 (step S750). It should be noted that when the parting step S750 is performed, the interposer substrate 510 is removed from the cover 92 along with the conductive pillars 510a. In other words, in the present embodiment, the mould 90 with the conductive pillars 510b (as shown in FIG. 8C) is designed, and the thermosetting material M1 is injected into the chamber 94 and cured. The cured thermosetting material M2 is then separated from the mould 90 to form the interposer substrate 510 with the conductive pillars 510b (as shown in FIG. 8E). Thus, the blind holes need not to be formed advance, and no plating or deposition process is required to form the conductive pillars 510b. Thus, the manufacturing procedure of the interposer substrate 510 is simplified, and accordingly the manufacturing cost of the interposer substrate 510 is reduced.

Figure 8F:
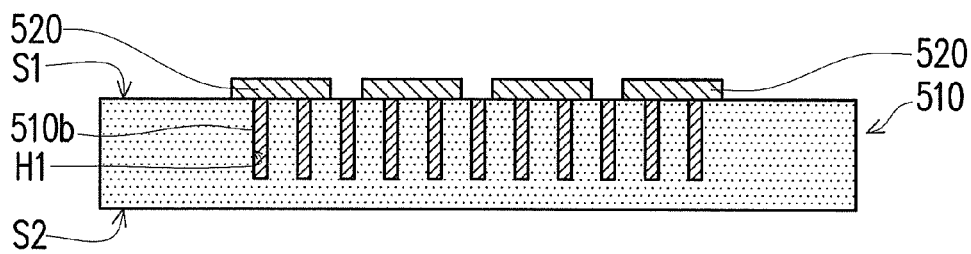
Figure 8G:
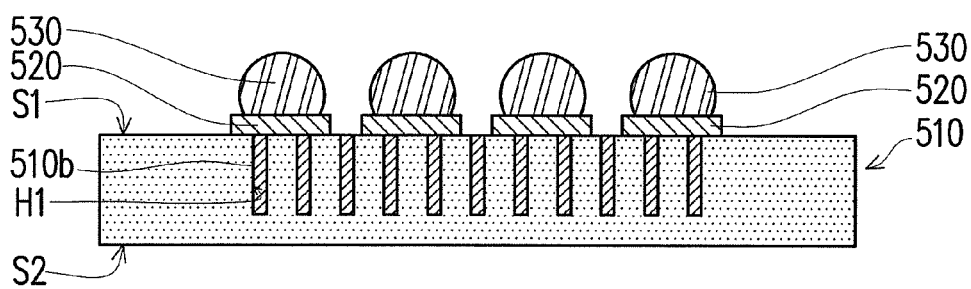
Figure 8H:
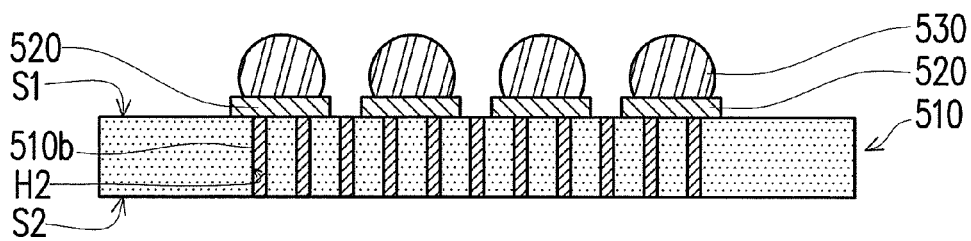

Thereafter, referring to FIG. 8F, a first conductive pattern layer 520 is formed on the first surface S1 of the interposer substrate 510, where the first conductive pattern layer 520 is a conductive wire structure and is electrically connected with the conductive pillars 510b (step S760). Referring to FIG. 8G, a plurality of first bumps 530 are formed on the first conductive pattern layer 520, where the first bumps 530 are electrically connected with the first conductive pattern layer 520. Referring to FIG. 8H, a processing step is performed on the second surface S2 of the interposer substrate 510 to turn the blind holes H1 into a plurality of through holes H2. To be specific, in the processing step, the second surface S2 of the interposer substrate 510 is polished, cut, or etched to expose the blind holes H1 and form the through holes H2.

Figure 8I:
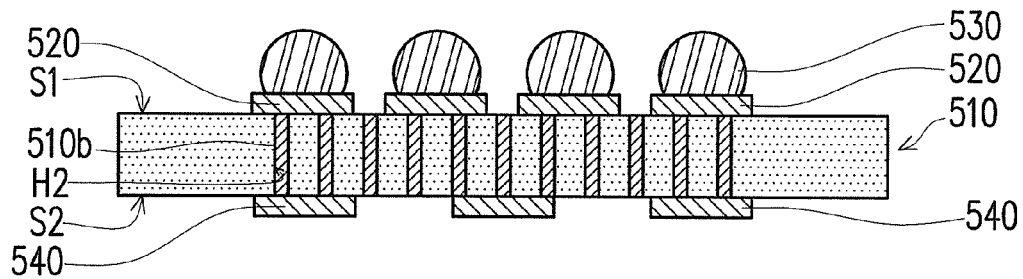
Figure 8J:
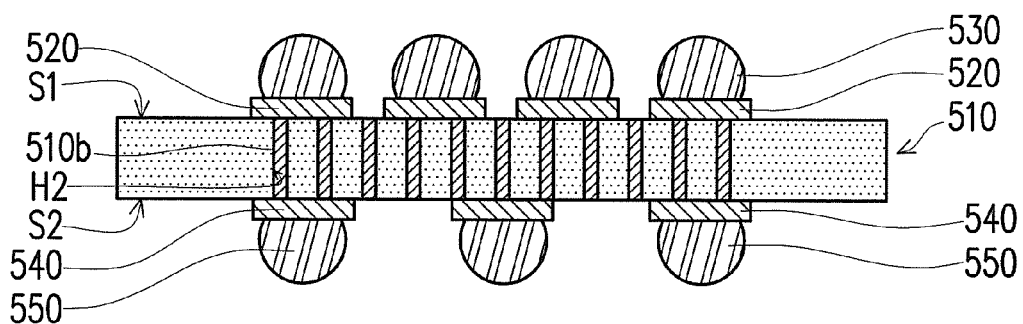

Next, referring to FIG. 8I, a second conductive pattern layer 540 is formed on the second surface S2 of the interposer substrate 510, where the second conductive pattern layer 540 is a conductive wire structure and is electrically connected with the conductive pillars 510b. referring to FIG. 8J, a plurality of second bumps 550 are formed on the second conductive pattern layer 540, where the second bumps 550 are electrically connected with the second conductive pattern layer 540.

Figure 8K:
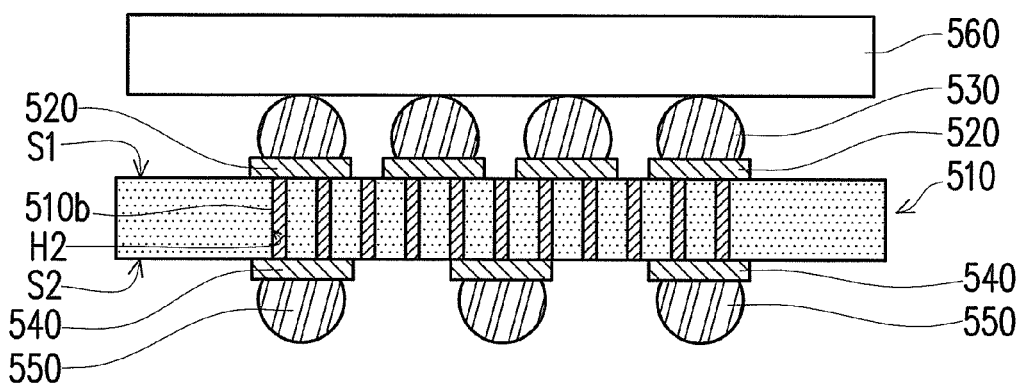
Figure 8L:
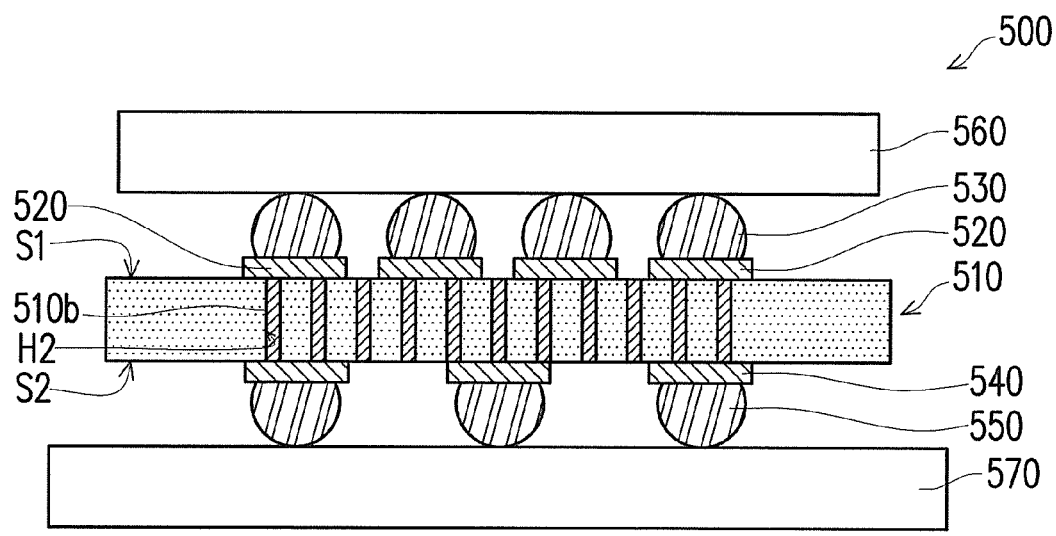

Next, referring to FIG. 8K, a chip 560 is stacked on the interposer substrate 510, and the chip 560 is electrically connected with the first conductive pattern layer 520 on the interposer substrate 510 through the first bumps 530. Referring to FIG. 8L, the chip 560 and the interposer substrate 510 are stacked on a substrate 570, and the substrate 570 is electrically connected with the second conductive pattern layer 540 of the interposer substrate 510 through the second bumps 550. In the present embodiment, the substrate 570 is an organic substrate made of an organic material. However, the present disclosure is not limited thereto. By now, the manufacturing procedure of a semiconductor device 500 is completed.

It should be noted that in the present embodiment, the shape and thickness of the interposer substrate 510 and the positions and depth of the conductive pillars 510a can be determined according to the actual design requirement and through the mould 90. In the present embodiment, as shown in FIG. 8C, the spacing D1 of the chamber 94 is approximately smaller than 5 mm, and the length of the conductive pillars 510a formed through the steps illustrated in FIG. 8B is D2 and is smaller than the spacing D1 of the chamber 94. Thus, the thickness of the interposer substrate 510 fabricated by using the mould 90 is approximately smaller than 5 mm (i.e., corresponding to the spacing D1 of the chamber 94 in FIG. 8C), where the positions and depth of the conductive pillars 510a in FIG. 8B are corresponding to the positions and depth of the conductive pillars 510a in the interposer substrate 510 illustrated in FIG. 8E. Additionally, the thickness of the chip 560 is about 0.7 mm, and the thickness of the substrate 570 is about 1-2 mm.

Figure 9:
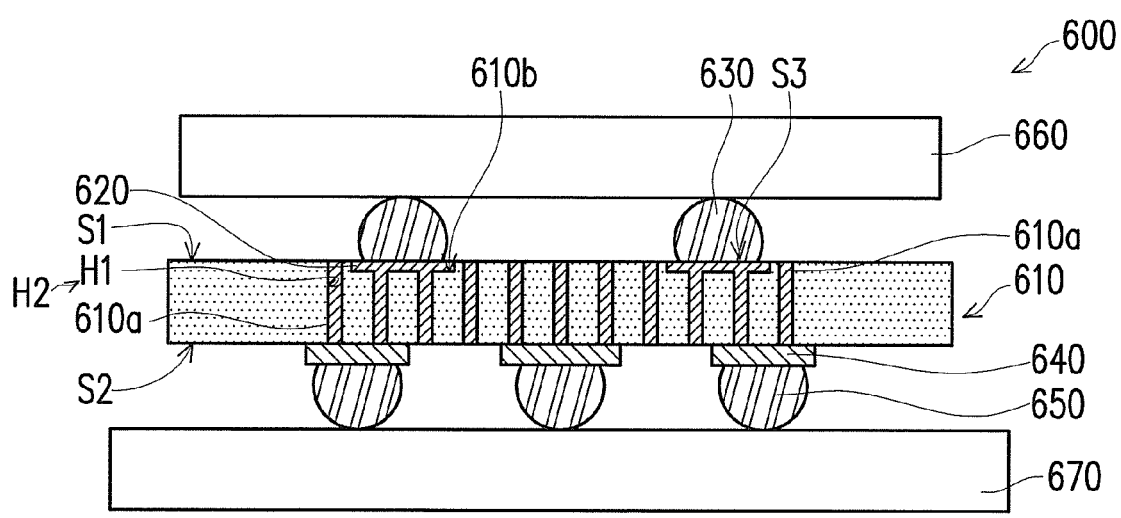
FIG. 9 is a diagram of a semiconductor device according to an embodiment of the present disclosure.

FIG. 9 is a diagram of a semiconductor device according to an embodiment of the present disclosure. Referring to FIG. 9, the semiconductor device 600 in the present embodiment includes an interposer substrate 610, a plurality of conductive pillars 610a, and a first conductive pattern layer 620. The interposer substrate 610 has a first surface S1. A plurality of blind holes H1 and a plurality of grooves 610b are formed on the first surface S1 of the interposer substrate 610. The grooves 610b are connected with part of the blind holes H1. A plurality of conductive pillars 610a are disposed in the blind holes H1 of the interposer substrate 610. The first conductive pattern layer 620 may be a conductive wire structure and is disposed in the grooves 610b.

It should be noted that in the present embodiment, the semiconductor device 600 with the first conductive pattern layer 620 illustrated in FIG. 9 can be manufactured through the semiconductor device manufacturing method illustrated in FIGS. 4A-4E. In the present embodiment, the surface S3 of the first conductive pattern layer 620 of the semiconductor device 600 is coplanar with the first surface S1 of the interposer substrate 610 (i.e., the first conductive pattern layer 620 does not protrude from the first surface S1 of the interposer substrate 610). Thus, the overall size of the semiconductor device 600 is reduced.

In the present embodiment, the semiconductor device 600 further includes a plurality of first bumps 630 disposed on the first conductive pattern layer 620. To be specific, the blind holes H1 are ran through the second surface S2 of the interposer substrate 610 to form a plurality of through holes H2, and the conductive pillars 510a are in the through holes H2. The semiconductor device 600 further includes a second conductive pattern layer 640 and a plurality of second bumps 650. The second conductive pattern layer 640 may be a conductive wire structure and disposed on the second surface S2 of the interposer substrate 610, and the second conductive pattern layer 640 is electrically connected with the conductive pillars 510a, where the second bumps 650 are disposed on the second conductive pattern layer 640.

Additionally, the semiconductor device 600 further includes a chip 660 and a substrate 670. The chip 660 is disposed on the substrate 670, where the interposer substrate 610 is between the substrate 670 and the chip 660. The chip 660 is electrically connected with the first conductive pattern layer 620 on the interposer substrate 610 through the first bumps 630, and the substrate 670 is electrically connected with the second conductive pattern layer 640 on the interposer substrate 610 through the second bumps 650. However, the first bumps 630, the second conductive pattern layer 640, the second bumps 650, and the stacking of the chip 660 and the substrate 670 can be fabricated through the semiconductor device manufacturing method illustrated in FIGS. 4F-4H.

As described above, embodiments of the present disclosure provide a semiconductor device and a manufacturing method thereof, in which an interposer substrate is fabricated by using an electrically insulating thermosetting material, and the shape and thickness of the interposer substrate and the positions and depth of conductive pillars are defined according to the actual design requirement and through a mould. To be specific, in the present embodiment, a mould with protrusions (or conductive pillars) is designed, and a thermosetting material is injected into the chamber and cured. The cured thermosetting material is then separated from the mould to form the interposer substrate with blind holes (or conductive pillars), and the thickness of the interposer substrate and the size of the protrusions (or conductive pillars) are defined through the mould. Thus, the manufacturing procedure is simplified. Besides, because no etching or laser process is performed to form the blind holes and no plating or deposition process is performed to form the conductive pillars, the manufacturing cost of the interposer substrate is reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of a semiconductor device, comprising:
providing a mould, wherein the mould has a chamber and a plurality of protrusions in the chamber;
injecting a thermosetting material into the chamber;
curing the thermosetting material;
separating the cured thermosetting material from the mould to form an interposer substrate, wherein a plurality of blind holes corresponding to the protrusions is formed on the interposer substrate;
filling a conductive material into the blind holes to form a plurality of conductive pillars; and
forming a first conductive pattern layer on a first surface of the interposer substrate, wherein the first conductive pattern layer is electrically connected with the conductive pillars, the chamber further comprises a plurality of patterns, and after separating the cured thermosetting material from the mould, a plurality of grooves corresponding to the patterns is formed on the interposer substrate, wherein a part of the blind holes is electrically connected with the grooves.

2. The manufacturing method according to claim 1 further comprising:
forming a plurality of first bumps on the first conductive pattern layer, wherein the first bumps are electrically connected with the first conductive pattern layer.

3. The manufacturing method according to claim 2 further comprising:
forming a second conductive pattern layer on a second surface of the interposer substrate, wherein the second conductive pattern layer is electrically connected with the conductive pillars; and
forming a plurality of second bumps on the second conductive pattern layer, wherein the second bumps are electrically connected with the second conductive pattern layer.

4. The manufacturing method according to claim 3 further comprising:
stacking a chip on the interposer substrate, wherein the chip is electrically connected with the first conductive pattern layer on the interposer substrate through the first bumps; and
stacking the chip and the interposer substrate on a substrate, wherein the substrate is electrically connected with the second conductive pattern layer on the interposer substrate through the second bumps.

5. The manufacturing method according to claim 1 further comprising performing a processing step on a second surface of the interposer substrate to turn the blind holes into a plurality of through holes.

6. The manufacturing method according to claim 1, wherein when the conductive material is filled into the blind holes to form the conductive pillars, the conductive material is also filled into the grooves to form the first conductive pattern layer electrically connected with the conductive pillars.

7. The manufacturing method according to claim 1 further comprising:
disposing a carrier substrate in the chamber before filling the thermosetting material into the chamber;
carrying the interposer substrate on the carrier substrate after separating the cured thermosetting material from the mould; and
removing the carrier substrate after forming the first conductive pattern layer on the first surface of the interposer substrate.

8. The manufacturing method according to claim 7 further comprising:
forming a buffer layer on the carrier substrate, wherein the protrusions of the mould are inserted into the buffer layer, and the blind holes and the conductive pillars penetrate the buffer layer; and
removing the carrier substrate and the buffer layer to allow the conductive pillars to protrude from the interposer substrate.

9. The manufacturing method according to claim 1, wherein the thermosetting material is an insulator.

* * * * *